United States Patent
Nakamura et al.

(10) Patent No.: US 7,542,323 B2
(45) Date of Patent: Jun. 2, 2009

(54) SEMICONDUCTOR MEMORY DEVICE HAVING A PLURALITY OF CHIPS AND CAPABILITY OF OUTPUTTING A BUSY SIGNAL

(75) Inventors: Hiroshi Nakamura, Fujisawa (JP); Kenichi Imamiya, Tokyo (JP); Ken Takeuchi, Stanford, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 455 days.

(21) Appl. No.: 10/949,274

(22) Filed: Sep. 24, 2004

(65) Prior Publication Data
US 2005/0036356 A1 Feb. 17, 2005

Related U.S. Application Data

(63) Continuation of application No. 10/754,993, filed on Jan. 8, 2004, now Pat. No. 6,990,003, which is a continuation of application No. 10/185,645, filed on Jun. 28, 2002, now Pat. No. 6,680,858.

(30) Foreign Application Priority Data

| Jun. 29, 2001 | (JP) | ............................. 2001-198132 |
| Dec. 11, 2001 | (JP) | ............................. 2001-377408 |
| May 31, 2002 | (JP) | ............................. 2002-159518 |

(51) Int. Cl.
*G11C 5/06* (2006.01)
(52) U.S. Cl. ............... 365/63; 365/189.05; 365/189.07; 365/191
(58) Field of Classification Search .................. 365/63, 365/189.07, 191, 189.05
See application file for complete search history.

(56) References Cited

U.S. PATENT DOCUMENTS

| 4,939,695 | A | * | 7/1990 | Isobe et al. .................. 365/222 |
| 4,954,951 | A | * | 9/1990 | Hyatt .......................... 711/218 |
| 5,163,144 | A | * | 11/1992 | Ikeno .......................... 711/152 |
| 5,889,722 | A | | 3/1999 | Numazaki et al. ........... 365/226 |
| 6,407,962 | B1 | | 6/2002 | Ka .............................. 365/233 |
| 6,438,045 | B1 | | 8/2002 | King et al. .................. 365/200 |

(Continued)

FOREIGN PATENT DOCUMENTS

JP 7-93499 4/1995

(Continued)

OTHER PUBLICATIONS

Satoshi Otsuka, "Application of Uniform-Block Type Flash Memory to Main Memory", *Electronic Technology*, Japan: Nikkan Kogyou Shimbunsha (Transliterated), Nov. 1, 1992, vol. 34, No. 12, pp. 16-22.

*Primary Examiner*—Pho M. Luu
(74) *Attorney, Agent, or Firm*—Frommer Lawrence & Haug LLP

(57) ABSTRACT

One package contains a plurality of memory chips. Each memory chip has an I/O terminal which generates a busy signal. The busy signal enables a busy state when a power supply voltage value reaches a specified and guaranteed range after a power-on sequence. The busy signal maintains the busy state until completion of initialization operations for the plurality of memory chips. The busy signal releases the busy state after completion of all initialization operations for the plurality of memory chips.

13 Claims, 22 Drawing Sheets

U.S. PATENT DOCUMENTS

| | | | | |
|---|---|---|---|---|
| 6,462,985 B2 | 10/2002 | Hosono et al. | ......... | 365/185.09 |
| 6,549,469 B2 * | 4/2003 | Gochi | ................... | 365/189.01 |
| 6,704,223 B2 | 3/2004 | Hosono et al. | ......... | 365/185.09 |
| 2001/0018724 A1 | 8/2001 | Sukegawa | ................... | 711/103 |

FOREIGN PATENT DOCUMENTS

| | | |
|---|---|---|
| JP | 8-63446 | 3/1996 |
| JP | 11-232886 | 8/1999 |
| JP | 2001-100181 | 4/2000 |

* cited by examiner

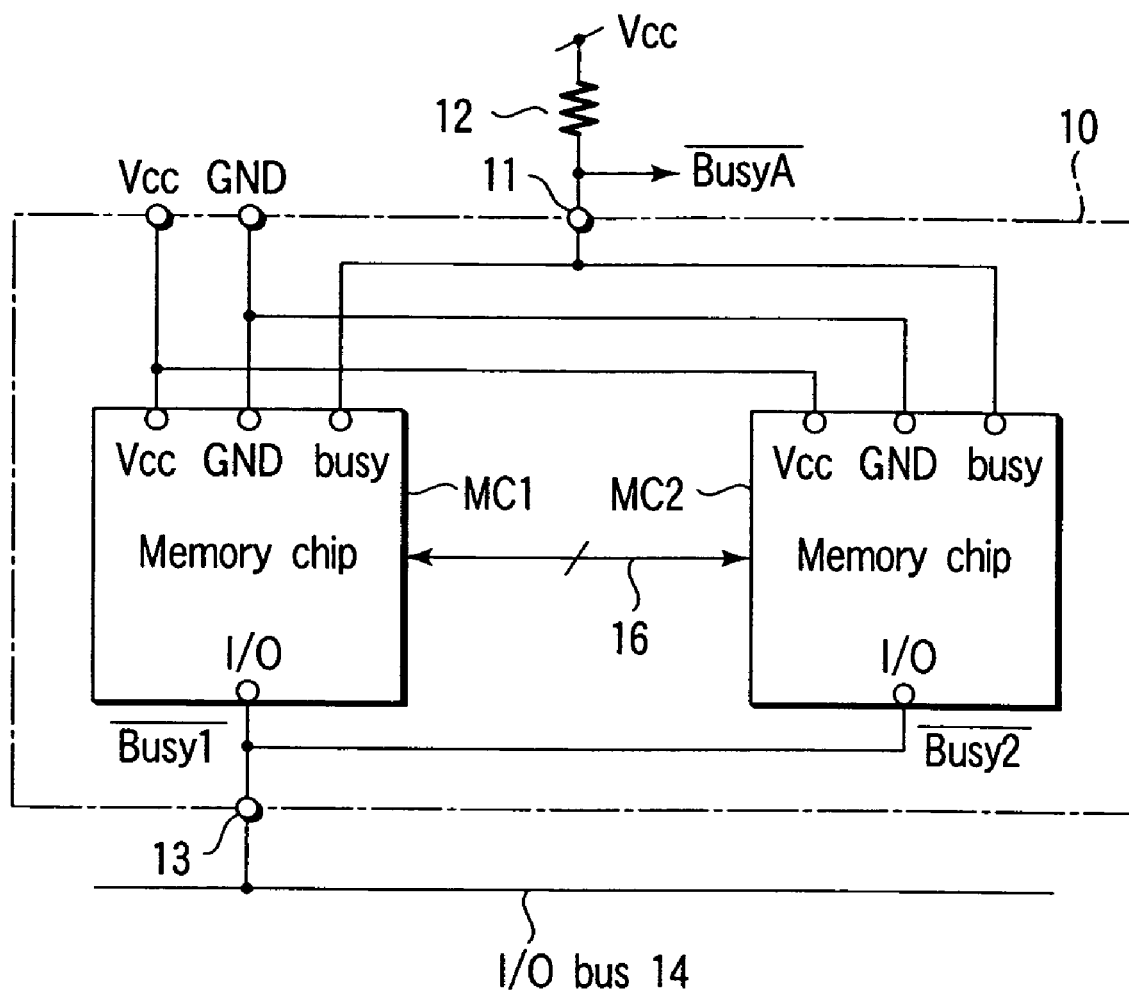
F I G. 3

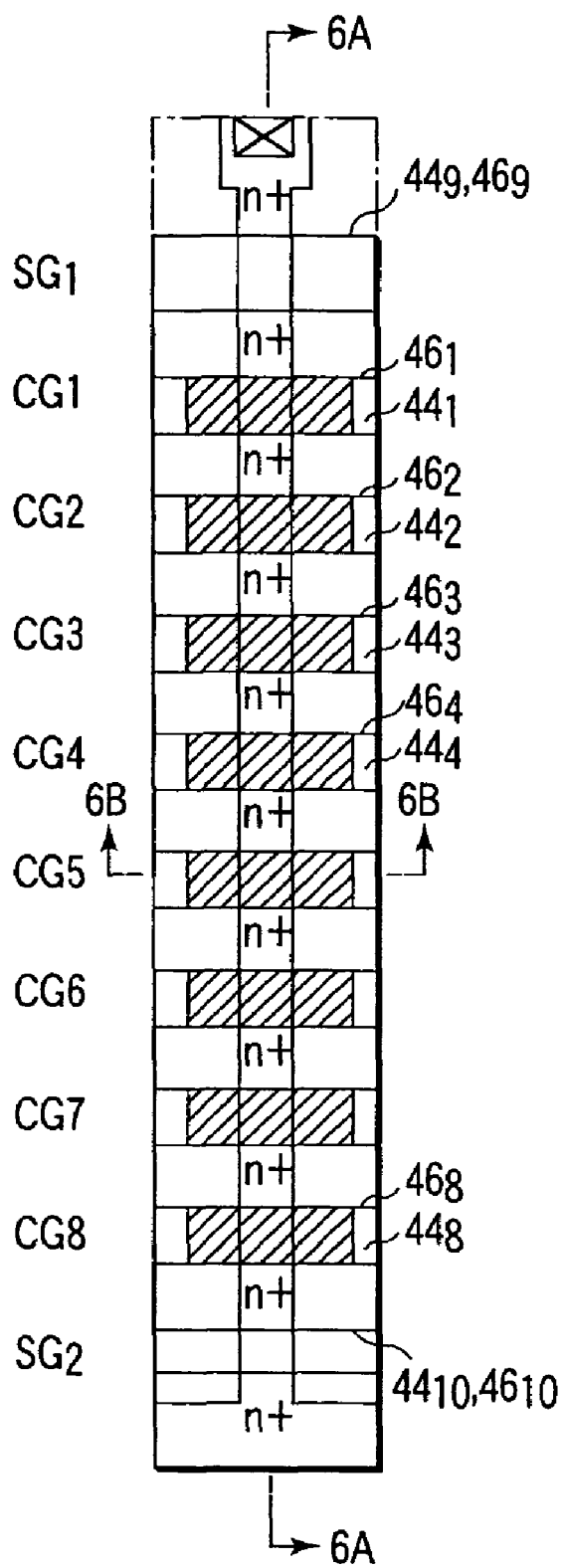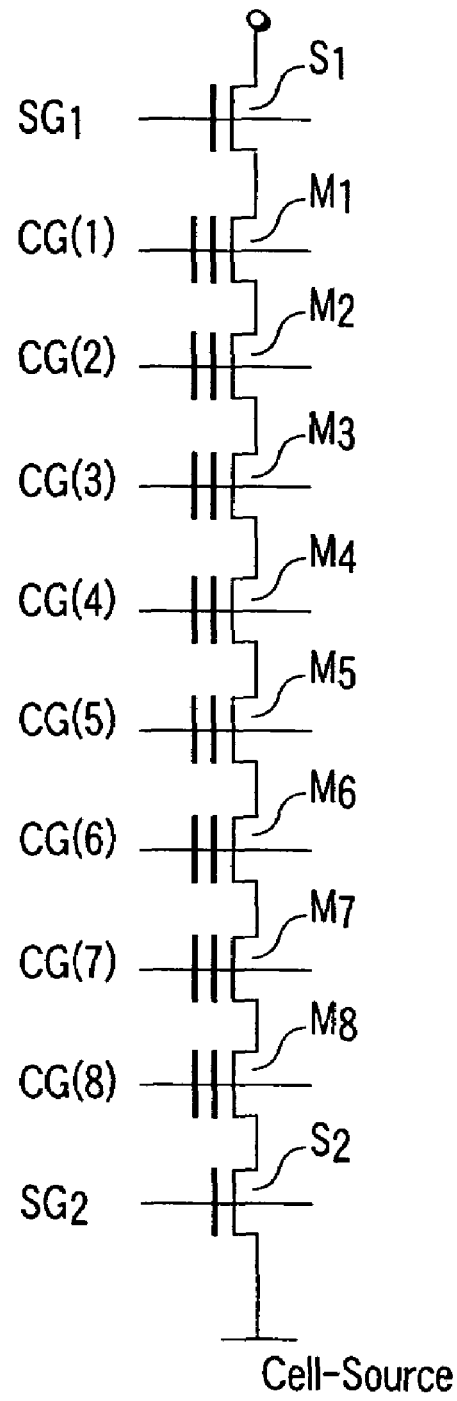
F I G. 5A                F I G. 5B

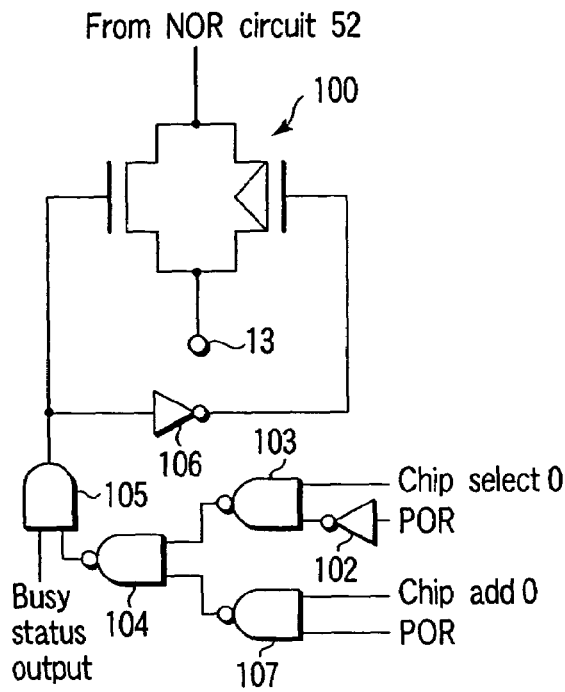 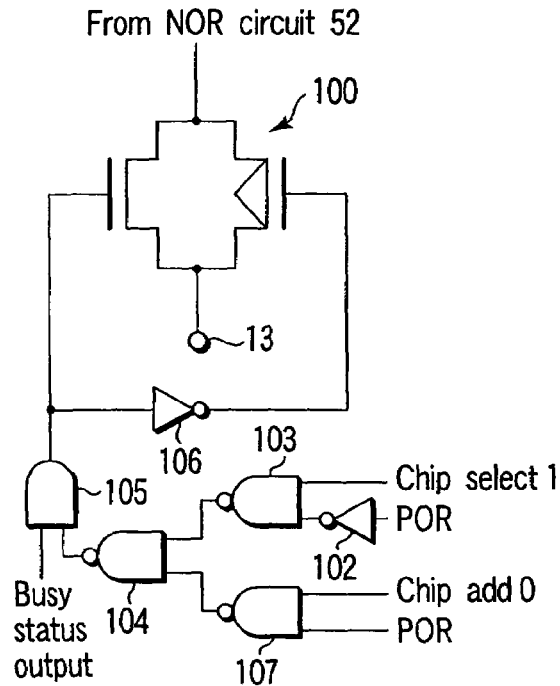
FIG. 10A     FIG. 10B
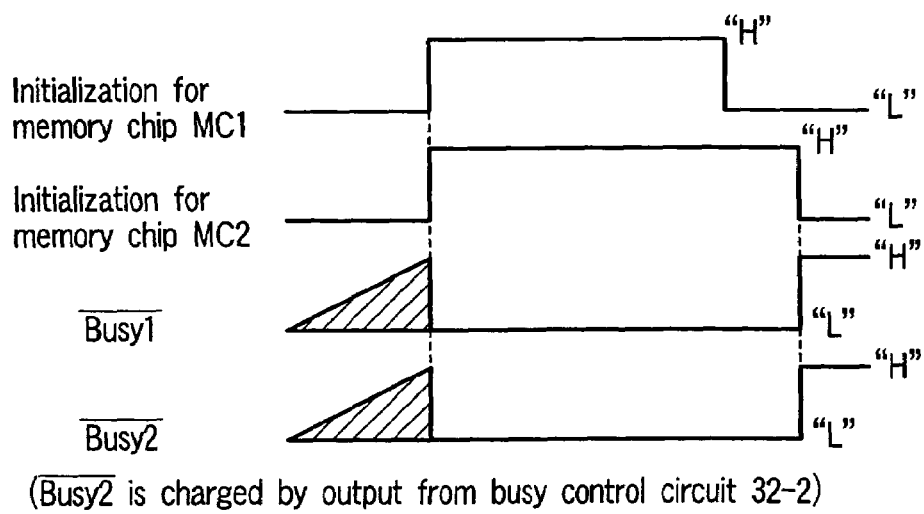
($\overline{Busy2}$ is charged by output from busy control circuit 32-2)
FIG. 11

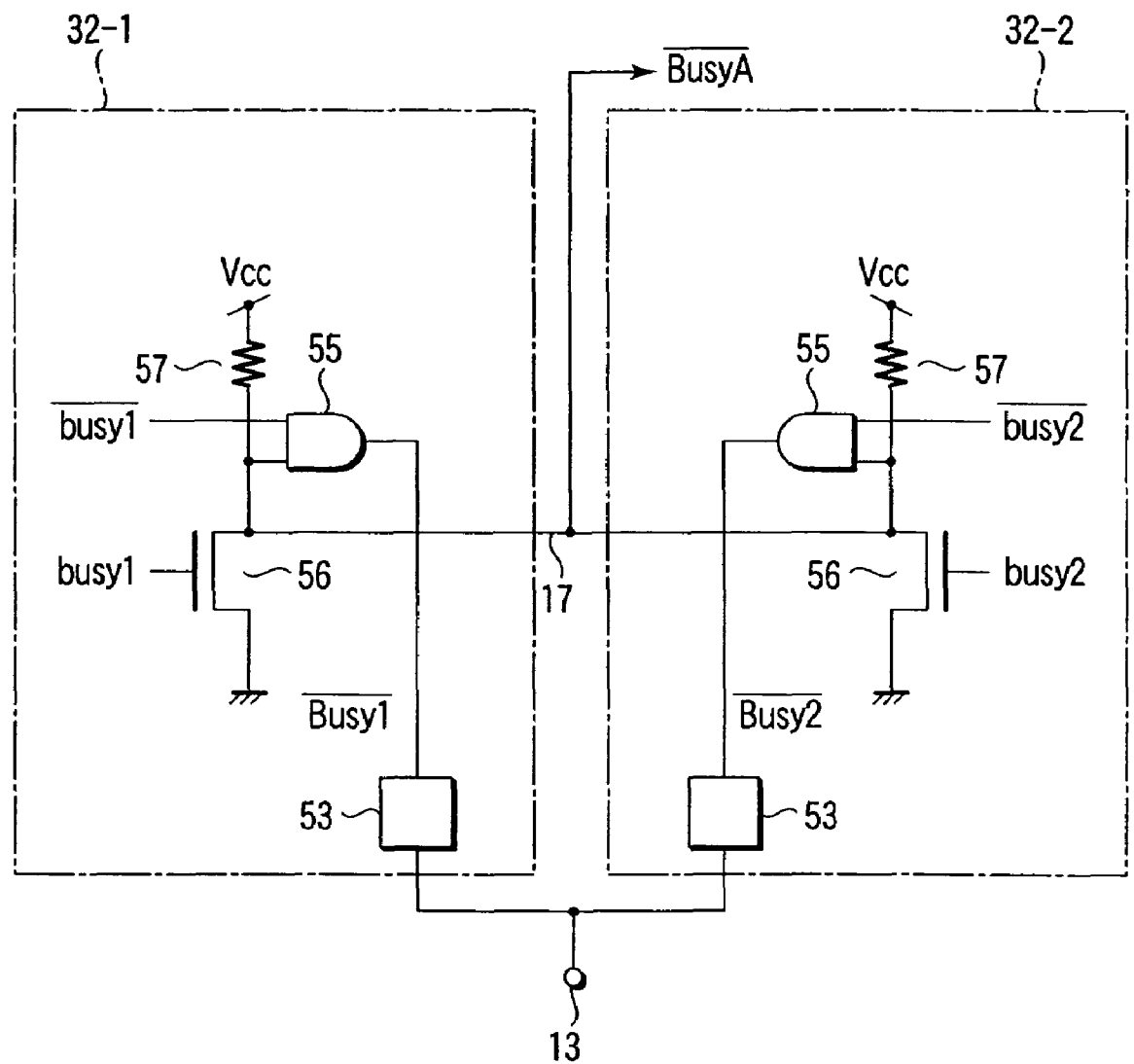
F I G. 16

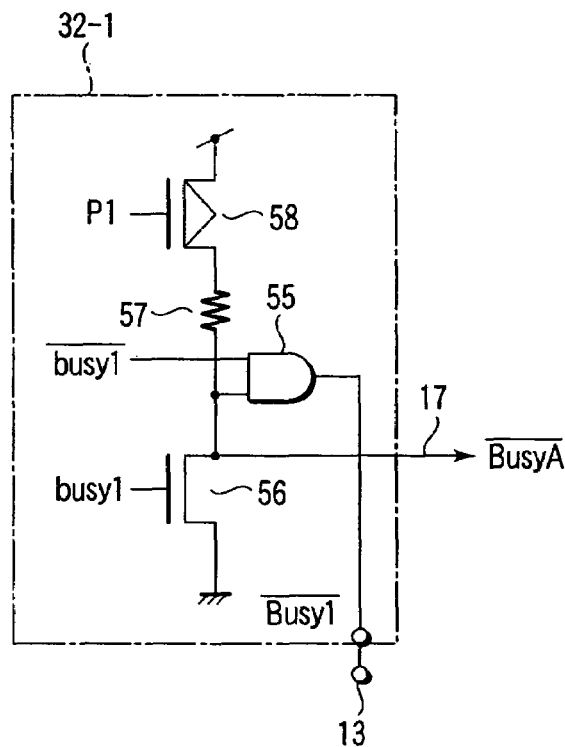
FIG. 18
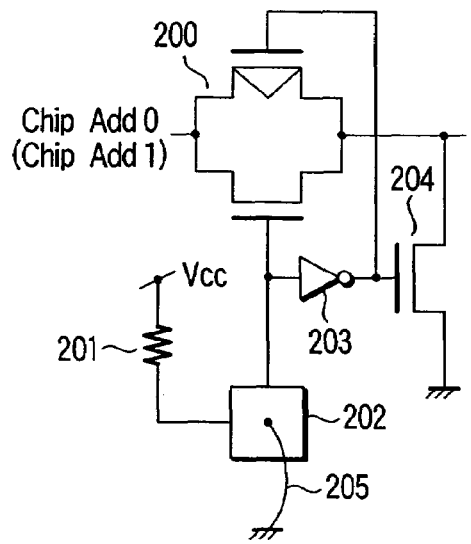
FIG. 21
FIG. 19A
FIG. 19B
FIG. 20

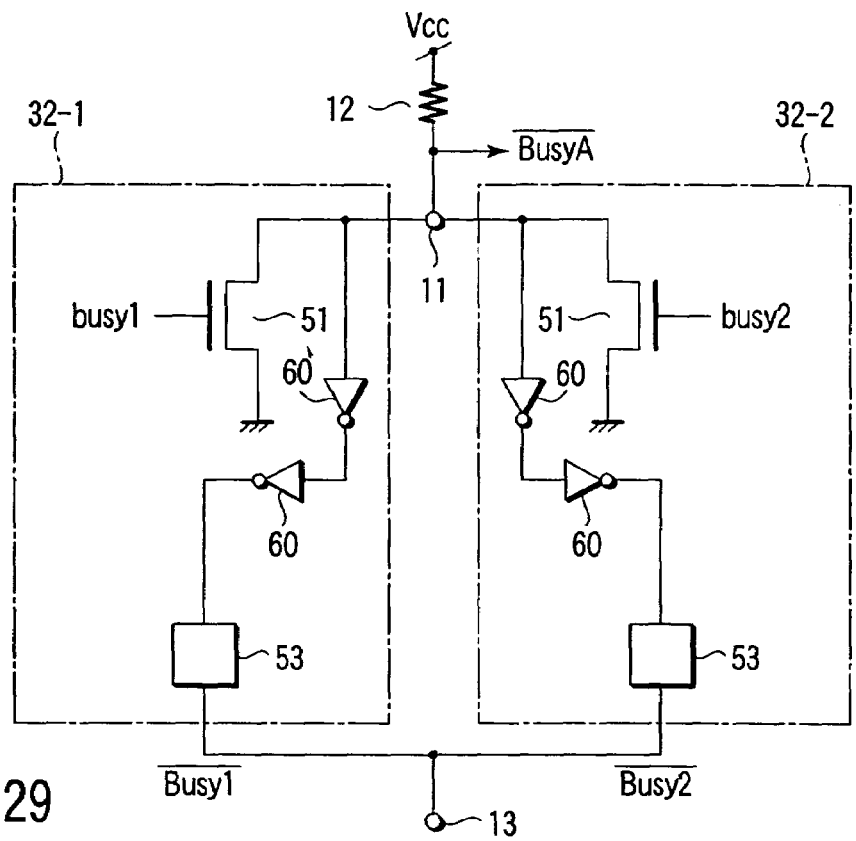
F I G. 29
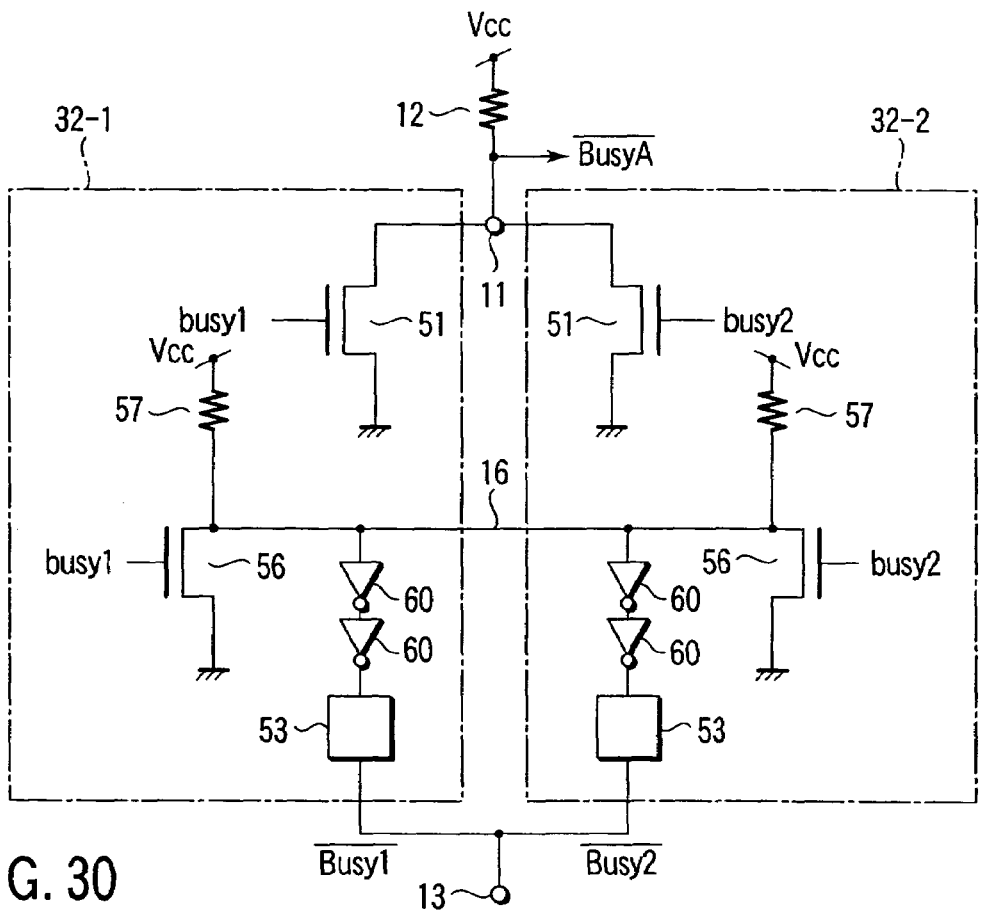
F I G. 30

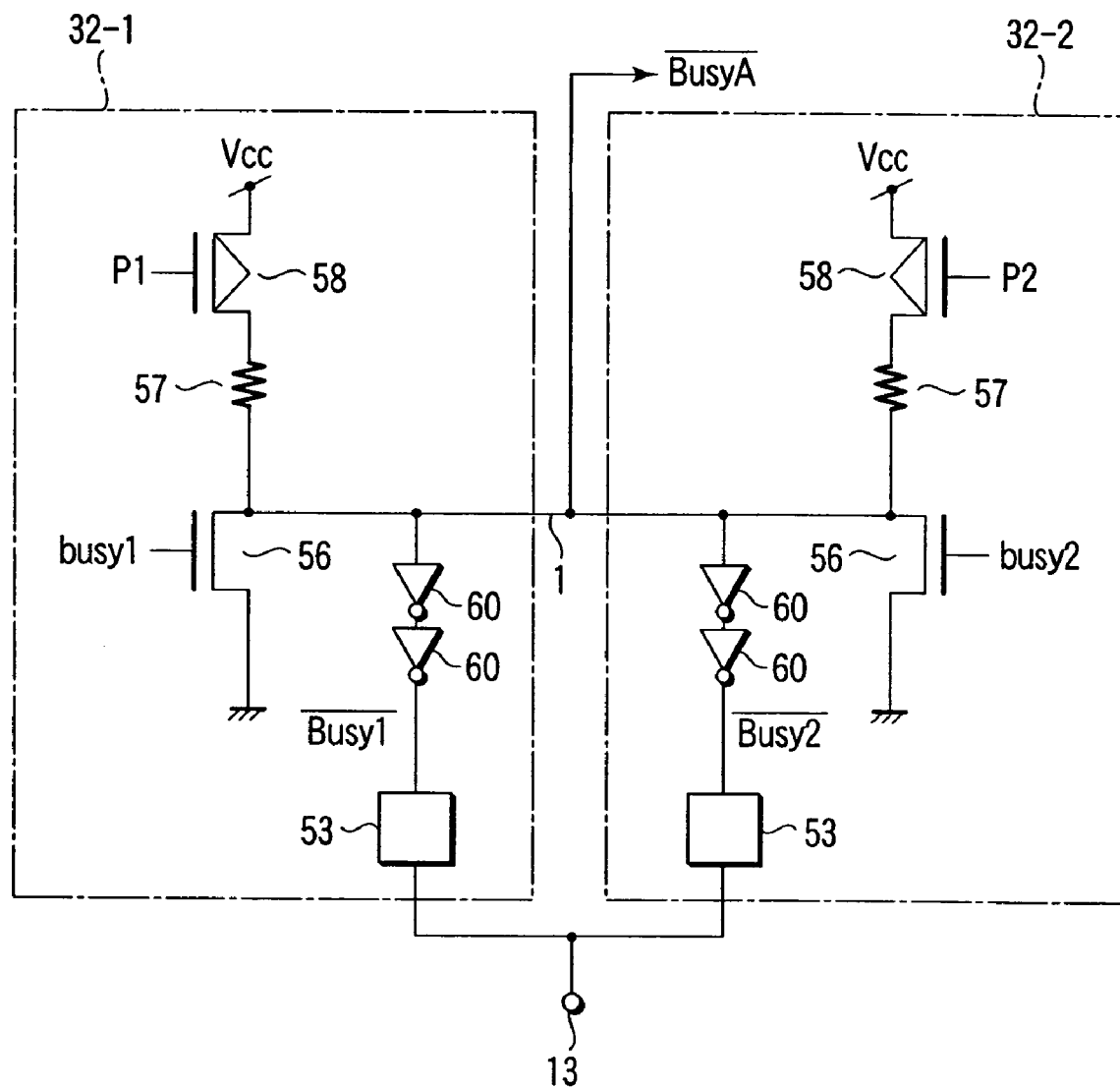
F I G. 33

F I G. 34A
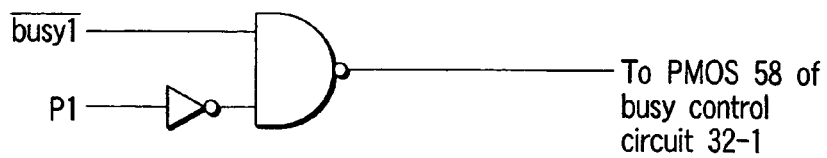
F I G. 34B
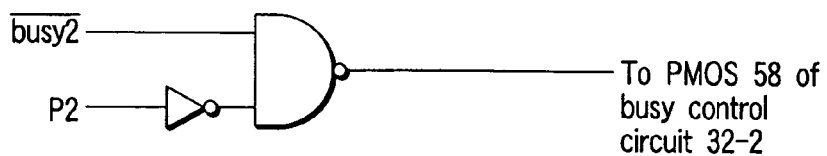
F I G. 35A
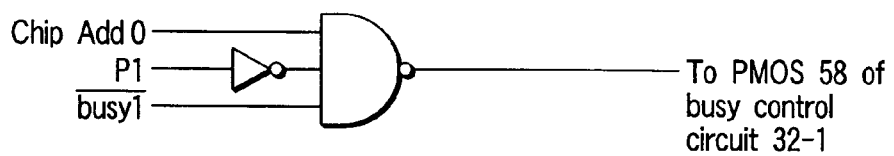
F I G. 35B
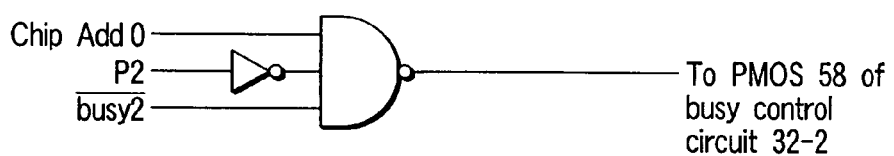
F I G. 36
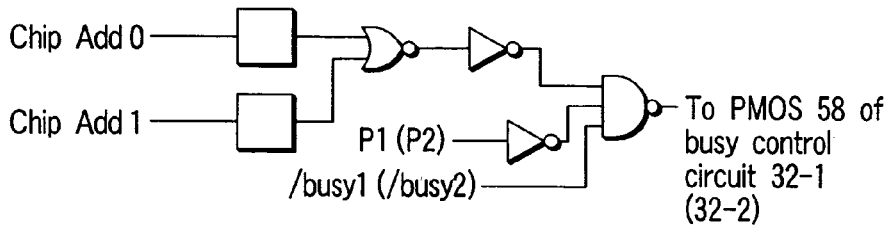
F I G. 37A
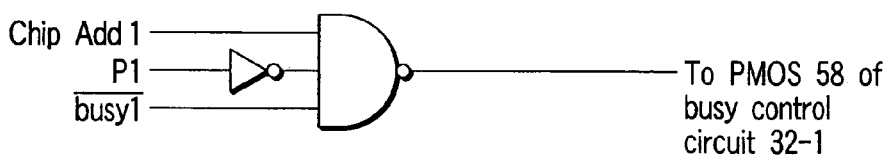
F I G. 37B
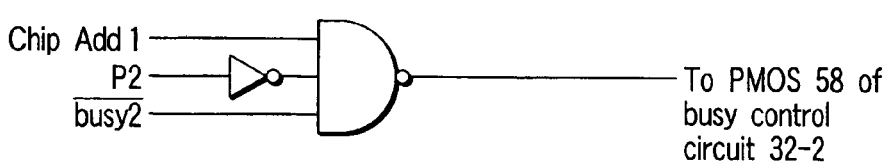

SEMICONDUCTOR MEMORY DEVICE HAVING A PLURALITY OF CHIPS AND CAPABILITY OF OUTPUTTING A BUSY SIGNAL

CROSS-REFERENCE TO RELATED APPLICATIONS

This application is a continuation of Ser. No. 10/754,993, filed Jan. 8, 2004 now U.S. Pat. No. 6,990,003, which is a continuation of Ser. No. 10/185,645, filed Jun. 28, 2002, now U.S. Pat. No. 6,680,858, granted Jan. 20, 2004, the entire contents of both application Ser. No. 10/754,993 and application Ser. No. 10/185,645 being incorporated herein by reference.

This application is based upon and claims the benefit of priority from the prior Japanese Patent Applications No. 2001-198132, filed Jun. 29, 2001; No. 2001-377408, filed Dec. 11, 2001; and No. 2002-159518, filed May 31, 2002, the entire contents of all of which are incorporated herein by reference.

BACKGROUND OF THE INVENTION

1. Field of the Invention

The present invention relates to a semiconductor memory device such as an IC card, a memory system, etc. including a plurality of semiconductor memory chips in a package.

2. Description of the Related Art

As a semiconductor memory device, there is widely known an EEPROM (Electrically Erasable Programmable Read Only Memory) chip which enables rewriting of data. With respect to large integration, particular attention is paid to a NAND-cell type EEPROM chip which configures a NAND cell by serially connecting a plurality of memory cells.

A memory device (chip) such as NAND-cell type EEPROM is generally initialized after a power-on sequence.

A memory chip such as NAND-cell type EEPROM comprises a large number of integrated memory cells. All memory cells are not fabricated normally during chip production. There is a high possibility of manufacturing defective memory cells. If just a single defective memory cell is included, that chip is determined to be defective and must be discarded. However, this method greatly increases manufacturing costs of memory chips.

As a solution, for example, the NAND-cell type EEPROM provides a spare block as a substitute for a defective memory cell. A block containing the defective memory cell is replaced by the spare block in units of blocks to normalize the memory chip containing the defective memory cell and increase the non-defective rate.

As an example of the above mentioned memory chip initialization, a spare block is substituted for the block containing a defective memory cell. Another example is a voltage trimming operation for optimizing various voltages used inside a memory chip.

Normally, the initialization operation is set to a given period, e.g., several hundreds of microseconds after the power supply voltage reaches a value within a specified range at the power-on time. During the initialization period, the memory chip cannot be controlled from the outside.

Conventionally, a system that uses the memory chip measures the time for the initialization, determines the end of the initialization, and then controls the memory chip.

In this case, the system using the memory chip requires an extra operation of measuring the time, complicating the memory chip control.

As a solution for this problem, the memory chip generates a busy signal at the power-on time. The busy signal indicates the busy state for a period after the power supply voltage reaches a value in the specified range and until the memory chip becomes controllable from the outside. Regarding the busy state output, for example, the NAND-cell type EEPROM conventionally has a capability of outputting the memory chip's busy state during operations of reading, writing, or erasing data. There have been used a method of determining the busy state by (A) outputting the busy state from a pad exclusively used for the busy state output or (B) outputting the busy state from an I/O pad immediately after a busy state output command is entered, and then a data output enable state takes effect.

Normally, systems or users use different methods of detecting the busy state. Convenience is improved by allowing the use of methods (A) and (B). Namely, both methods (A) and (B) are indispensable.

Conventionally, a package product mounted with a plurality of memory chips has been used for EEPROM, IC cards or memory systems containing memory chips such as EEPROM. A widely used method allows one package to include a plurality of memory chips for increasing the memory capacity of an IC card, memory system, etc. One example is a package product including a plurality of nonvolatile memory chips.

On the package product including a plurality of memory chips, a busy state must be detected at the power-on time until the chip initialization is complete for all nonvolatile memory chips in the package.

FIG. 1 is a block diagram schematically showing a conventional packaged memory device including a plurality of memory chips. The example here shows that two memory chips MC1 and MC2 are included. The memory chips MC1 and MC2 in a memory device 10 are supplied with a power supply voltage Vcc and a ground voltage GND. Busy state output pads for the memory chips MC1 and MC2 are commonly connected to a busy state output terminal 11. The output terminal 11 is connected to a node for the power supply voltage Vcc via a load resistor 12. I/O pads of the memory chips MC1 and MC2 are connected to an I/O terminal 13. The I/O terminal 13 is connected to an I/O bus 14.

The output terminal 11 generates a busy signal /BusyA causing an "L" level when at least one of memory chips MC1 and MC2 is busy. A slash (/) for /BusyA indicates an inverted signal.

When a busy state output command is entered to the memory device 10, the I/O terminal 13 outputs busy signal /Busy1 or /Busy2. This busy signal causes an "L" level when the corresponding memory chip is busy.

A package product containing a plurality of memory chips requires a busy state to be output until all memory chips in the package have been initialized after the power is turned on. Accordingly, busy states must be output from all the memory chips in the package. Each memory chip outputs a signal representing the busy state via the I/O pad and the I/O terminal 13.

Generally, an output time width for the busy signal at the power-on time depends on chips and therefore differs among chips. When one chip is busy, another may be ready, i.e., not busy.

FIG. 2 is a timing chart showing an example of operations after the power is turned on until each chip becomes ready to be controlled externally on the conventional memory device as shown in FIG. 1. When the power is turned on and the power supply voltage exceeds a specified value, an initialization operation starts in each of the memory chips MC1 and MC2. The period of this initialization is indicated with an "H" level. For example, let us assume that the memory chip MC2 requires a longer time for initialization than the memory chip MC1

After the initialization starts, the memory chips MC1 and MC2 output busy signals /Busy1 and /Busy2 indicative of the busy state via the I/O terminal 13. The "L" levels of the busy signal /Busy1 and /Busy2 correspond to the busy state. The busy state is released when the initialization for each chip is complete. The busy signal /Busy2 becomes ready after /Busy1. Namely, there is caused a different logical level state (TX in FIG. 2) between the busy signals /Busy1 and /Busy2. During the TX period, the busy signal /Busy1 output from the memory chip MC1 maintains the "H" level. The busy signal /Busy2 output from the memory chip MC2 maintains the "L" level. When the busy state output command is entered to the memory device 10 during the TX period, then busy signals /Busy1 and /Busy2 are output from the memory chips MC1 and MC2, a short circuit occurs between the power supply voltage Vcc and the ground voltage GND via the memory chips. MC1 and MC2. This short circuit may cause the chip to malfunction due to the raised ground voltage level or lowered supply voltage level in each chip. Each chip is generally set to cause a large amount of output current to flow from the I/O pad. A large amount of current may flow between chips via the I/O bus 14, causing a possibility of destroying the device itself.

BRIEF SUMMARY OF THE INVENTION

An aspect of the present invention, there is provided a semiconductor memory device including a plurality of memory chips in a package, wherein a busy state takes effect when the power supply voltage reaches a specified value after a power-on sequence; the busy state is maintained until completion of an initialization operation for the plurality of memory chips; and the busy state is released after completion of all initialization operations for the plurality of memory chips.

BRIEF DESCRIPTION OF THE SEVERAL VIEWS OF THE DRAWING

FIG. 3 is a block diagram schematically showing a basic configuration of a memory device according to the present invention;

FIG. 5A is a plan view of one NAND cell in the memory cell array in FIG. 4 and FIG. 5B is an equivalent circuit diagram thereof;

FIGS. 10A and 10B are circuit diagrams showing in detail a configuration of the output control circuit provided in the busy control circuit in FIG. 8;

FIG. 11 is a timing chart showing an operation example of the busy control circuit using the output circuit in FIGS. 9A and 9B;

FIG. 16 is a circuit diagram specifically showing a partial configuration of a busy control circuit in a memory device according to a fourth embodiment;

FIG. 18 is a circuit diagram specifically showing a partial configuration of a busy control circuit in a memory device according to a sixth embodiment;

FIGS. 19A and 19B are circuit diagrams showing configurations of the control circuits provided in the circuit according to the embodiment in FIG. 17;

FIG. 20 is a circuit diagram showing a configuration of another control circuit provided in the circuit according to the embodiment in FIG. 17;

FIG. 21 is a circuit diagram showing a detailed configuration of a switch circuit in FIG. 20;

FIG. 29 is a circuit diagram showing a modified configuration of the circuit embodied in FIG. 13;

FIG. 30 is a circuit diagram showing a modified configuration of the circuit embodied in FIG. 14;

FIG. 33 is a circuit diagram showing a modified configuration of the circuit embodied in FIG. 17;

FIGS. 34A and 34B are circuit diagrams showing another configuration of the control circuits provided in the circuit according to the embodiment in FIG. 17;

FIGS. 35A and 35B are circuit diagrams showing another configuration of the control circuits provided in the circuit according to the embodiment in FIG. 17;

FIG. 36 is a circuit diagrams showing another configuration of the control circuits provided in the circuit according to the embodiment in FIG. 17; and FIGS. 37A and 37B are circuit diagrams showing another configuration of the control circuits provided in the circuit according to the embodiment in FIG. 17.

DETAILED DESCRIPTION OF THE INVENTION

Figure 1:
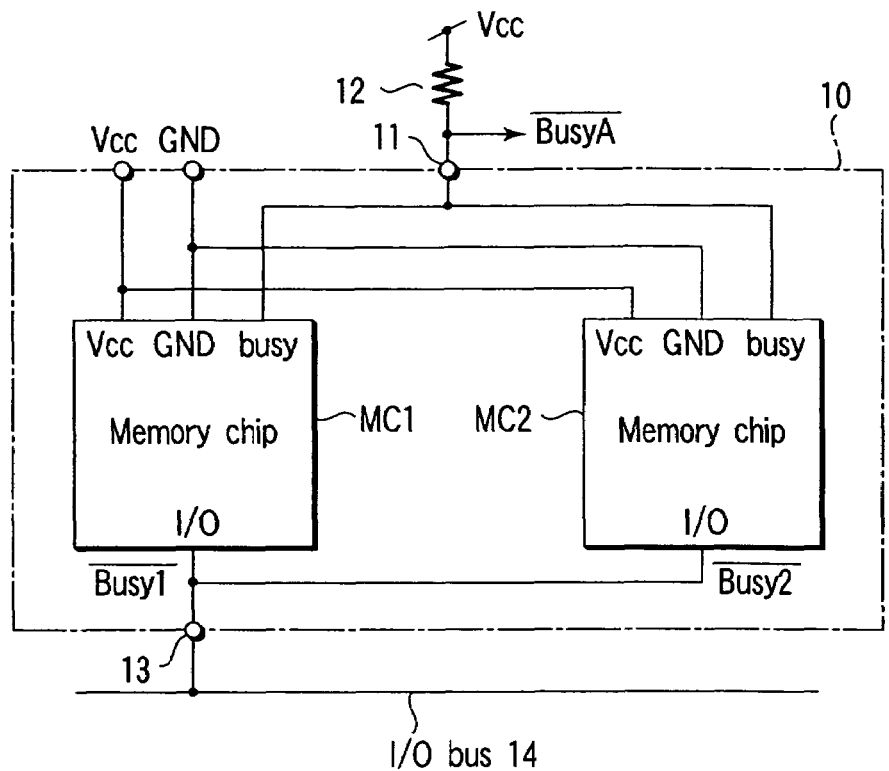
FIG. 1 is a block diagram schematically showing a configuration of a conventional memory device.
Figure 2:
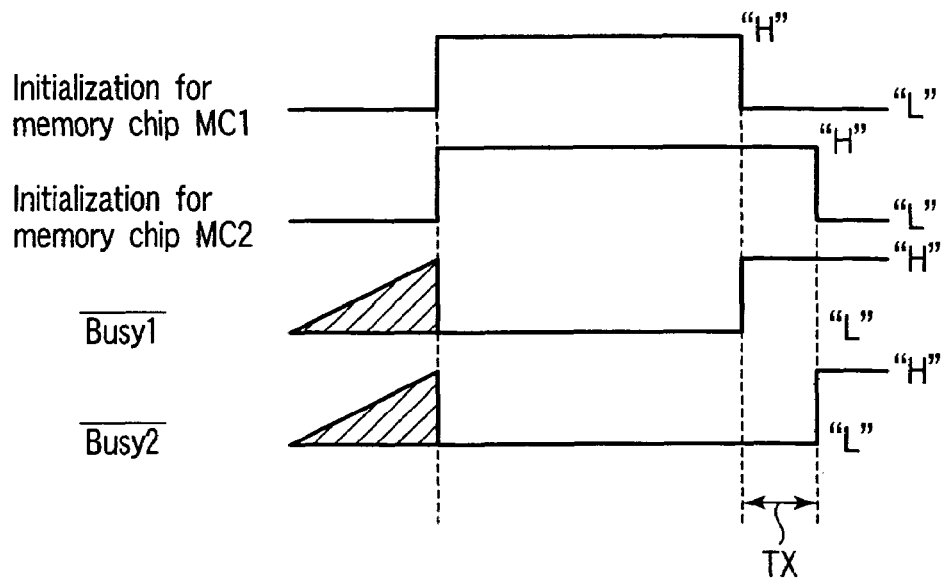
FIG. 2 is a timing chart showing an example of operations in the memory device in FIG. 1.

Embodiments of the present invention will be described in further detail with reference to the accompanying drawings.

FIG. 3 is a block diagram schematically showing a basic configuration of a memory device according to the present invention. The memory device 10 contains a plurality of EEROM memory chips, each includes a plurality of NAND cells, in a single package. In the example, there are included two memory chips MC1 and MC2. It may be preferable to use two or more memory chips.

The memory chips MC1 and MC2 in the memory device 10 are supplied with the power supply voltage Vcc and the ground voltage GND. Busy state output pads for the memory chips MC1 and MC2 are commonly connected to the busy state output terminal 11. The output terminal 11 is connected to a node for the power supply voltage Vcc via the load resistor 12. I/O pads of the memory chips MC1 and MC2 are commonly connected inside the package and are further connected to the I/O terminal 13 of the memory device 10. The I/O terminal 13 is connected to an I/O bus 14.

The output terminal 11 generates a busy signal /BusyA causing an "L" level during a busy state of the memory chip MC1 or MC2, whichever causes the longer busy state. A slash (/) for /BusyA signifies an inverted signal.

At least one wire 16 is provided between the memory chips MC1 and MC2. Each memory chip's busy state is transmitted therebetween via the wire 16.

The I/O terminal 13 outputs busy signals /Busy1 and /Busy2.

A package product containing a plurality of memory chips requires a busy state to be output until all memory chips in the package have been initialized at the power-on time. Accordingly, busy states must be output from all the memory chips in the package. Each memory chip outputs a signal representing the busy state via the I/O terminal 13.

The I/O terminal 13 outputs a busy state only in the data output enable state. When a data output disable state takes effect, the I/O terminal 13 always remains in a floating state. Accordingly, the busy signals /Busy1 and /Busy2 always go to the floating state in the data output disable state. Normally, a control pin (pad voltage in the chip) is used for control of the data output enable/disable states. Basically, the following description about busy outputs of /Busy1 and /Busy2 refers to the above-mentioned method (B), i.e., states of /Busy1 and /Busy2 in the data output enable state after a busy state output command is entered.

Figure 4:
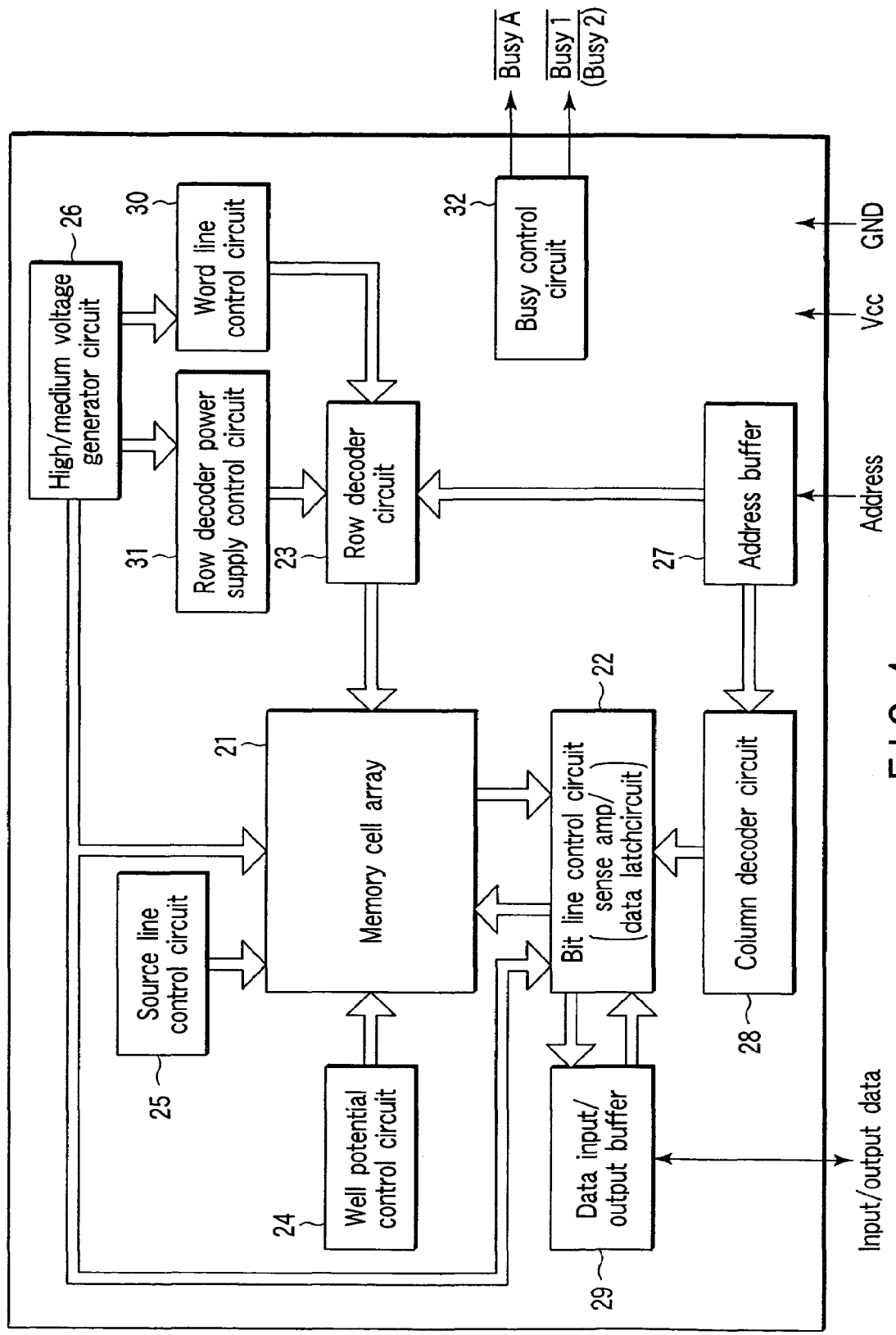
FIG. 4 is a block diagram showing an internal configuration of the memory chip in FIG. 3.

FIG. 4 is a block diagram showing an internal configuration of each of the memory chips MC1 and MC2 in FIG. 3.

In FIG. 4, a memory cell array 21 is provided with a plurality of NAND-type memory cells each having a control gate, a floating gate, and a select gate. The plurality of NAND cells are divided into blocks. The memory cell array 21 connects with a bit line control circuit 22, a row decoder circuit 23, a well potential control circuit 24, a source line control circuit 25, and a high/medium voltage generator circuit 26.

The bit line control circuit 22 connects with a column decoder circuit 28 and a data input/output buffer 29. The column decoder circuit 25 receives an address signal output from an address buffer 27. According to an output signal from the column decoder circuit 28, the bit line control circuit 22 reads, writes, rewrites, write-verifies, read-verifies, and erases data. Namely, the bit line control circuit 22 mainly includes CMOS flip-flop circuits. The bit line control circuit 22 latches data to be written into a memory cell, senses data for reading a bit line potential or for a read-verify after writing, and latches data to be rewritten.

The row decoder circuit 23 connects with an address buffer 27, a word line control circuit 30, and a row decoder power supply control circuit 31. The row decoder circuit 23 controls the memory cell's control gate and select gate. The word line control circuit 30 controls a word line voltage in a selected block. The row decoder power supply control circuit 31 controls the power supply voltage of the row decoder circuit 23.

The well potential control circuit 24 controls a voltage of a p-type well region or a p-type substrate where the memory cell array 21 is formed. The source line control circuit 25 controls a voltage of a source line in the memory cell array 21. The high/medium voltage generator circuit 26 generates a high voltage for erasing data and high and medium voltages for writing data. These voltages are supplied to the p-type well region being erased, to a word line being written via the word line control circuit 30, the row decoder power supply control circuit 31, and the row decoder circuit 23, and to a bit line via the bit line control circuit 22.

Each memory chip is further provided with a busy control circuit 32. The busy control circuit 32 outputs two types of busy signals /BusyA and /Busy1 (or /Busy2) indicative of the busy state. The busy signals are output at the power-on time after the power supply voltage reaches a value in the specified and guaranteed range until the memory chip becomes controllable from the outside. Alternatively, the busy signals are output when data is read, written, or erased during normal operations after the power-on sequence.

Figure 6A:
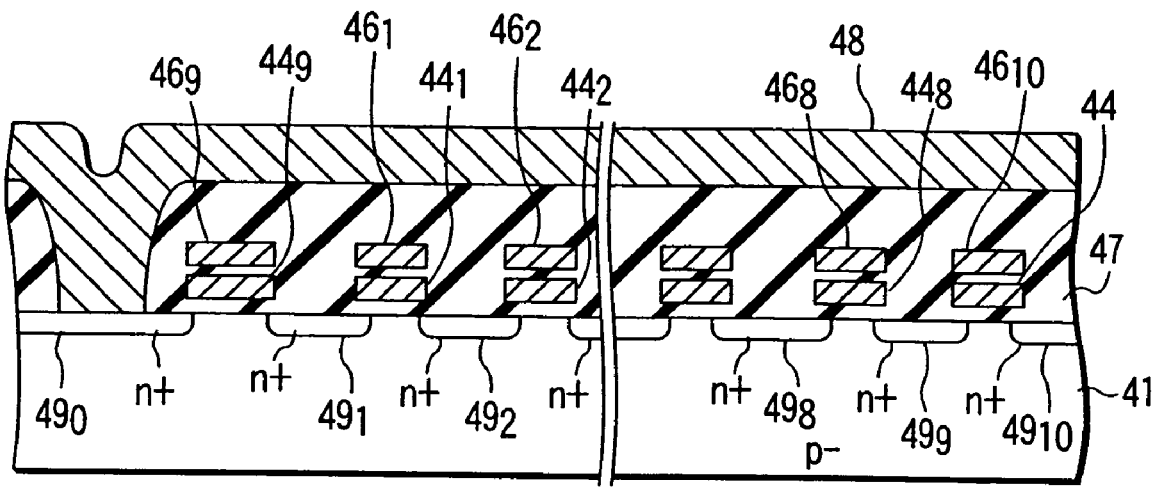
FIGS. 6A and 6B are different sectional views of the NAND cell in FIGS. 5A and 5B.
Figure 6B:
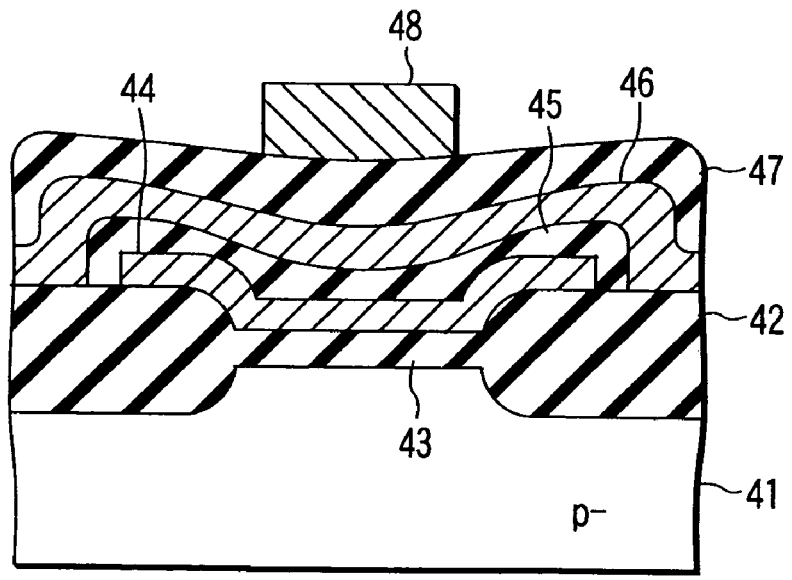

FIG. 5A is a plan view of one NAND type memory cell in the memory cell array 21 in FIG. 4. FIG. 5B is an equivalent circuit diagram of FIG. 5A. FIG. 6A is a cross sectional view taken along lines 6A-6A in FIG. 5A. FIG. 6B is a cross sectional view taken along lines 6B-6B in FIG. 5A. The same parts or components in FIGS. 5A, 5B, 6A, and 6B are depicted by the same reference numerals.

As shown in FIGS. 5A, 5B, 6A, and 6B, a memory cell including a plurality of NAND cells which is formed in a p-type silicon substrate (or a p-type well region) surrounded by an element-isolation oxide film 42. One NAND cell is provided with, e.g., eight memory cells $M_1$ through $M_8$. The eight memory cells $M_1$ through $M_8$ are connected serially.

In each memory cell, there are formed floating gates 44 ($44_1$, $44_2$, . . . , $44_8$) on a substrate 41 via a gate insulating film 43. Above the floating gates 44 ($44_1$, $44_2$, . . . , $44_8$), there are formed control gates 46 ($46_1$, $46_2$, . . . , $46_8$) via a gate insulating film 45. Each of n-type diffusion layers $49_1$, $49_2$, . . . , $49_8$ configures a source and a drain of the memory cell. Adjacent n-type diffusion layers are shared to serially connect the memory cells.

The drain and source sides of each NAND cell are respectively provided with the select gates $44_9$ and $46_9$, and $44_{10}$ and $46_{10}$. These select gates are formed simultaneously with the memory cell's floating gate and control gate. The substrate 41 where the memory cells are formed is covered with an inter-layer insulating film 47. A bit line 48 is formed on the inter-layer insulating film 47. The bit line 48 is connected to a drain diffusion layer $49_0$ at one end of the NAND cell.

The NAND cell's control gates 46 ($46_1$, $46_2$, . . . , $46_8$) are commonly arranged in the row direction as control gate lines $CG_1$, $CG_2$, . . . , and $CG_8$. These control gate lines are used as word lines. The select gates $44_9$ and $46_9$, and $44_{10}$ and $46_{10}$ are also contiguously arranged in the row direction and are used as select gate lines $SG_1$ and $SG_2$.

Figure 7:
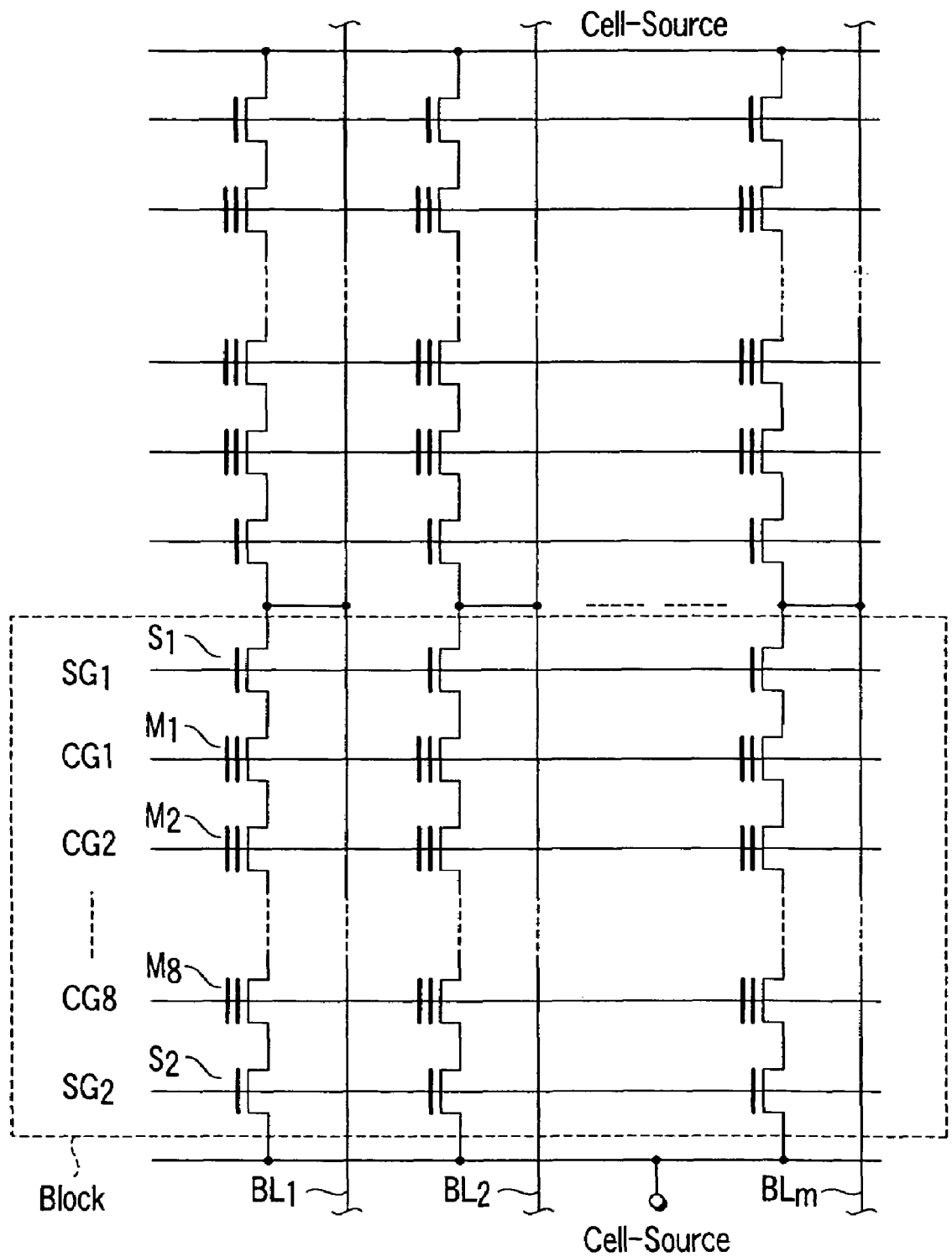
FIG. 7 is an equivalent circuit diagram of the memory cell array in FIG. 4.

FIG. 7 shows an equivalent circuit of the memory cell array where the NAND cells are arranged in a matrix. A group of NAND cells shares the word line or the select gate line and is referred to as a block. An area enclosed in a broken line in FIG. 7 is assumed to be one block. Normally, one of a plurality of blocks is selected for reading or writing data in the memory cell.

The following describes operations of writing, erasing, and reading data in the above-mentioned NAND-cell type EEPROM.

A data write operation is performed sequentially from a memory cell at the position farthest from the bit line contact. A high voltage Vpgm (e.g., approximately 18 V) is applied to the selected memory cell's control gate. A medium voltage Vmw (e.g., approximately 10 V) is applied to the memory cell's control gate and select gate. According to the data, 0 V or a medium voltage Vmb (e.g., approximately 8 V) is applied to the bit line.

When the bit line is supplied with 0 V, the potential is transmitted to the selected memory cell's drain. A tunnel current causes electron injection from the drain to the floating gate. At this time, the selected memory cell's threshold voltage shifts to positive value. This state is assumed to be "1", for example. When the bit line is supplied with the medium potential Vmb, no electron injection occurs. Accordingly, the threshold voltage does not change and remains to be negative. This state is assumed to be "0".

Data is erased in units of blocks. Namely, data is erased at a time from all memory cells in the selected NAND cell. In other words, all control gates in the selected NAND cell block are set to 0 V. A high voltage Vera (e.g., approximately 22 V) is applied to the p-type well region (or the p-type substrate). A floating state is enabled for the bit line, the source line, control gates in unselected NAND cell blocks, and all select gate lines. Thus, the tunnel current emits a floating gate's electron into the p-type well region (or the p-type substrate) and shifts the threshold voltage to the negative value in all memory cells of the selected NAND cell block.

During a data read operation, the selected memory cell's control gate is set to 0 V. The control gates and the select gates of the other memory cells are approximately set to the power supply voltage Vcc or a read voltage VH slightly higher than the power supply voltage. Normally, the read voltage VH is twice Vcc or less having a value of 5 V or less. In this state, data is sensed by detecting whether or not a current is supplied to the selected memory cell.

Let us assume that the memory device 10 in FIG. 3 provides control to keep both the memory chips MC1 and MC2 busy until they are initialized completely. For this purpose, it is necessary to detect busy states of the other memory chips in the same package. To do this, there are two methods: (1) detecting busy states of the other memory chips by using the busy signal /BusyA output from the busy state output terminal 11 and (2) detecting busy states of the other memory chips by using the exclusively used the wire 16 commonly connected to all chips in the package.

Method (1) has the advantage of preventing wires in the package or pads in the chip from increasing. However, the busy signal /BusyA is output to the busy state output terminal 11 which is available outside the chip and may be subject to the wiring capacity, the voltage application, etc. in the system. Detailed examinations are needed with respect thereto.

According to method (2), the exclusively used wire is provided only in the package and need not be provided outside the package, eliminating the need for detailed examinations with respect to the wiring capacity, the voltage application, etc. in the system. However, method (2) has a disadvantage of increasing the number of wires in the package or pads in the chip. An examination should be made to select method (1) or (2) according to uses of the package product.

Figure 8:
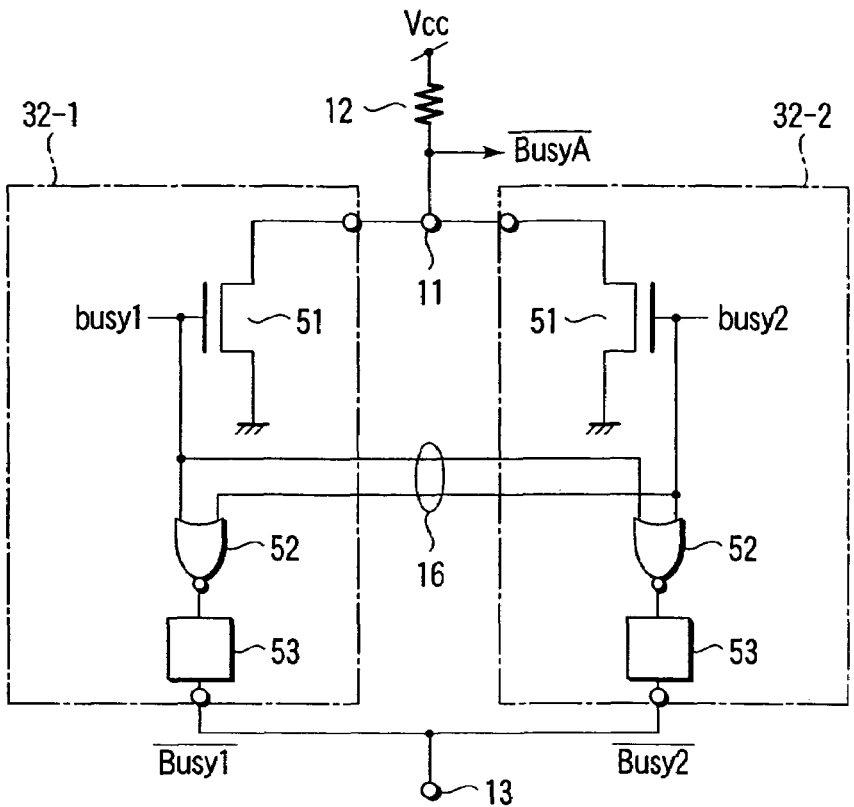
FIG. 8 is a circuit diagram specifically showing a partial configuration of a busy control circuit in a memory device according to a first embodiment.

FIG. 8 is a circuit diagram specifically showing a partial configuration of the busy control circuit 32 in FIG. 4 which is provided in each of the two memory chips MC1 and MC2 in the memory device according to a first embodiment of the present invention. In this case, the above mentioned method (2) is used.

The busy control circuit 32 has the same circuit configuration in both memory chips MC1 and MC2. The busy control circuits are represented by the reference numerals 32-1 and 32-2 in the memory chips MC1 and MC2, respectively.

At the power-on time, the memory chips MC1 and MC2 generate internal busy signals busy1 and busy2. Each of busy signals busy1 and busy2 is supplied to the gate of an N-channel MOS transistor 51 and one input terminal of a 2-input NOR circuit 52 in the busy control circuits 32-1 and 32-2. The source of the transistor 51 is connected to the ground voltage node. The drain is connected to the busy state output terminal 11 via the pad on the chip. As mentioned above, the terminal 11 is connected to the node of the power supply voltage Vcc via the load resistor 12.

The other input terminal of the 2-input NOR circuit 52 is mutually supplied with an internal busy signal generated in the other busy control circuit via one of two wires 16. The NOR circuit 52 forms a detection circuit for detecting busy states in the other memory chips. When a busy state output command is entered, each NOR circuit 52 outputs the busy signals /Busy1 and /Busy2 to the corresponding I/O terminal 13 via the I/O pad on the chip.

There is provided an output control circuit 53 between the output node of the NOR circuit 52 and the I/O terminal 13. The output control circuit 53 outputs a busy signal during a period after the power supply voltage reaches a value in the specified and guaranteed range at the power-on time until the memory chip becomes controllable from the outside. This period is referred to as a power-on reset period. Further, the output control circuit 53 outputs a busy signal in accordance with a command input when data is read, written, or erased during normal operations after termination of the power-on reset period.

FIGS. 9A and 9B and FIGS. 10A and 10B show in detail different configurations of the output control circuit 53 provided in the circuit in FIG. 8.

The following details the output control circuit 53 shown in FIGS. 9A and 9B and FIGS. 10A and 10B prior to description of operations of the circuit in FIG. 8.

Figure 9A:
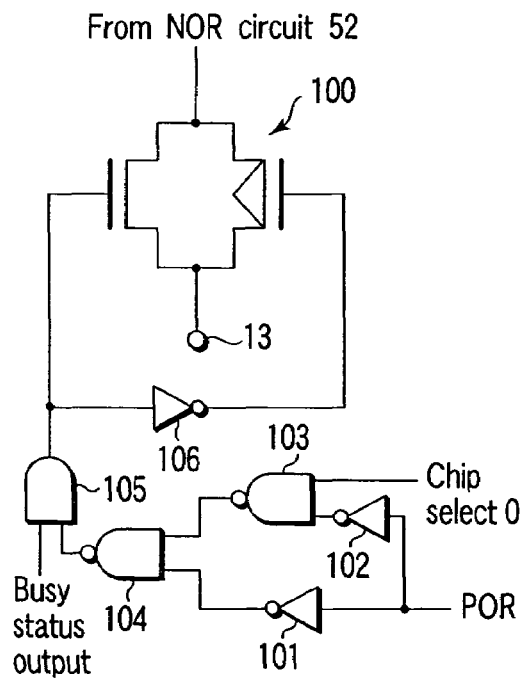
FIGS. 9A and 9B are circuit diagrams showing in detail a configuration of an output control circuit provided in the busy control circuit in FIG. 8.
Figure 9B:
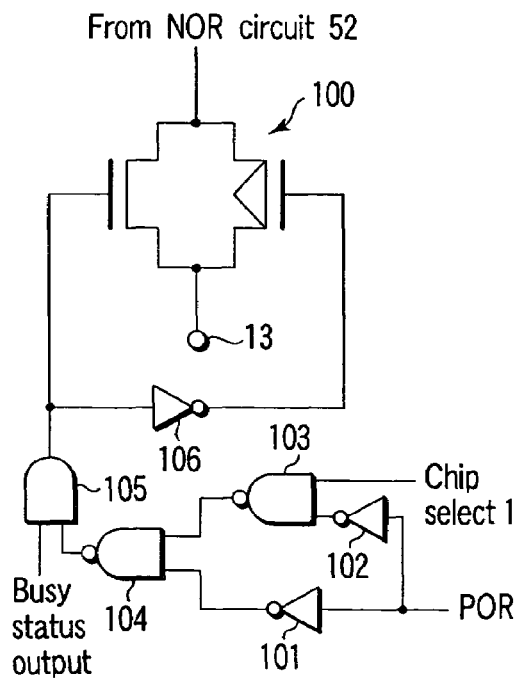

FIGS. 9A and 9B show detailed circuit configurations of the output control circuit 53 provided in the busy control circuits 32-1 and 32-2. Here, it is assumed that chip address 0 is assigned to the memory chip MC1 where the busy control circuit 32-1 is provided. Further, it is assumed that chip address 1 is assigned to the memory chip MC2 where the busy control circuit 32-2 is provided.

As shown in FIG. 9A, the output control circuit 53 provided in the busy control circuit 32-1 includes a CMOS transfer gate 100, inverters 101 and 102, NAND circuits 103 and 104, an AND circuit 105, and an inverter 106. The CMOS transfer gate 100 provides the parallel source/drain connection in P-channel and N-channel MOS transistors.

The inverters 101 and 102 each invert a power-on reset signal POR which goes to the "H" level during a power-on reset period. The NAND circuit 103 is supplied with an output from the inverter 102 and a chip select signal chip select0 which goes to the "H" level in response to selection of the memory chip MC1 provided with the busy control circuit 32-1. The NAND circuit 104 is supplied with outputs from the inverter 101 and the NAND circuit 103. The AND circuit 105 is supplied with an output from the NAND circuit 104 and a Busy-Status-Output signal. The inverter 106 inverts an output from the AND circuit 105. Outputs from the AND circuit 105 and the inverter 106 are supplied to the N-channel and P-channel MOS transistors' gates in the CMOS transfer gate 100. After the busy state output command is entered, and then the data output enable state takes effect, the Busy-Status-Output signal becomes "H" level. Accordingly, when the Busy-Status-Output signal is "H" level, the busy signals /Busy1 and /Busy2 are output to the I/O terminal 13.

FIG. 9B shows the output control circuit 53 provided in the busy control circuit 32-2. This busy control circuit has basically the same configuration as for the circuit in FIG. 9A. A difference from FIG. 9A is that the NAND circuit 103 is supplied with the chip select signal chip select1 instead of chip select0. The chip select signal chip select1 goes to the "H" level in response to selection of the memory chip MC2 provided with the busy control circuit 32-2.

During the power-on reset period, the power-on reset signal POR goes to the "H" level. At this time, an output from the inverter 101 goes to the "L" level. An output from the NAND circuit 104 goes to the "H" level. Accordingly, each CMOS transfer gate 100 goes on in the busy control circuits 32-1 and 32-2. The busy signals /Busy1 and /Busy2 output from the NOR circuit 52 in FIG. 8 are passed to each output control circuit 53 and are output to the I/O terminal 13 via the I/O pad on each chip.

When using the output control circuit 53 according to the configurations as shown in FIGS. 9A and 9B, all memory chips in the memory device 10, output a busy signal from the I/O terminal during the power-on reset period.

Not all memory chips in the memory device 10 need to be used to output the busy signal from the I/O terminal. For doing this, it is also possible to use a single chip in the memory device, e.g., the chip with chip address 0. Also when a single chip is used, the chip for output uses a signal on the wire 16 to detect the busy state of the other chips and outputs the busy state reflecting this detection result. Consequently, the memory device 10 can correctly output the busy state. FIGS. 10A and 10B show circuit configuration examples for implementing a method of outputting the busy state by using a single chip with chip address 0.

FIGS. 10A and 10B show detailed circuit configurations of the output control circuit 53. Here, it is assumed that chip address 0 is assigned to the memory chip MC1 where the busy control circuit 32-1 is provided. Further, it is assumed that chip address 1 is assigned to the memory chip MC2 where the busy control circuit 32-2 is provided.

As shown in FIG. 10A, the output control circuit 53 provided in the busy control circuit 32-1 includes a CMOS transfer gate 100, a NAND circuit 107, an inverter 102, a NAND circuit 103, a NAND circuit 104, an AND circuit 105, and an inverter 106. The CMOS transfer gate 100 provides the parallel source/drain connection in P-channel and N-channel MOS transistors. The NAND circuit 107 is supplied with a power-on reset signal POR going to the "H" level during the power-on reset period and a signal chip Add0 going to the "H" level only in the chip with chip address 0 (going to the "L" level in chips in the other chip addresses). The inverter 102 inverts the reset signal POR. The NAND circuit 103 is supplied with an output from the inverter 102 and a chip select signal chip select0 going to the "H" level in response to selection of the memory chip MC1 provided with the busy control circuit 32-1. The NAND circuit 104 is supplied with outputs from the both NAND circuits 107 and 103. The AND circuit 105 is supplied with output from the NAND circuit 104 and the Busy Status Signal. The inverter 106 inverts the output from the AND circuit 105. Outputs from the AND circuit 105 and the inverter 106 are supplied to the N-channel and P-channel MOS transistors' gates in the CMOS transfer gate 100.

FIG. 10B shows the output control circuit 53 provided in the busy control circuit 32-2. This busy control circuit has basically the same configuration as for the circuit in FIG. 10A. A difference from FIG. 10A is that the NAND circuit 103 is supplied with the chip select signal chip select1 instead of chip select0. As shown in FIG. 10B, the NAND circuit 107 is supplied with chip Add0 as a chip address similarly to FIG. 10A. The chip address signal chip Add0 goes to the "H" level in the memory chip MC1, i.e., in the busy control circuit 32-1. The chip address signal chip Add0 goes to the "L" level in the memory chip MC2, i.e., in the busy control circuit 32-2. During the power-on reset period, a busy signal is output to the I/O terminal 13 from only the memory chip MC1.

After completion of the power-on reset period, the same operation is performed whether the output control circuit in FIGS. 9A and 9B or FIGS. 10A and 10B is used. After completion of the power-on reset period, an output from the inverter 102 goes to the "H" level. When a busy signal is output in response to command input during operations of reading, writing, and erasing data, only the selected chip's chip select signal goes to the "H" level. When a chip select signal with the selection state enabled is input to the NAND circuit 103, an output from this circuit goes to the "L" level. When the memory chip is selected, an output from the NAND circuit 104 in the memory chip goes to the "H" level. After the busy state output command is entered, and then the data output enable state takes effect, this state turns on only the CMOS transfer gate 100 in the busy control circuit of the selected memory chip. The busy signal /Busy1 or /Busy2 output from the NOR circuit 52 is passed to the output control circuit 53, and then is output to the I/O terminal 13 via the I/O pad on the chip.

Figure 12:
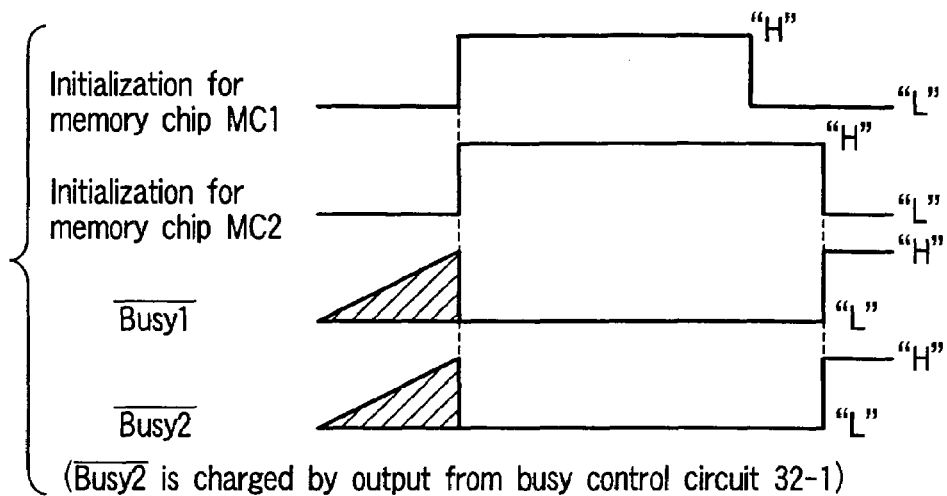
FIG. 12 is a timing chart showing an operation example of the busy control circuit using the output circuit in FIGS. 10A and 10B.

Referring now to timing charts in FIGS. 11 and 12, the following describes an example of operations in the memory device in FIG. 8 according to the first embodiment after the power is turned on until two memory chips MC1 and MC2 become controllable from the outside. In FIGS. 11 and 12, the /Busy1 and /Busy2 levels are used to show output levels of data from the I/O terminal 13 when the data output from the I/O terminal is enabled. When the data output is disabled, the I/O terminal 13 always becomes the floating state. This state corresponds to the power-on reset period. When the circuits in FIGS. 9A and 9B are used as the output control circuits 53, and the data output enable state takes effect, the /Busy1 and /Busy2 signals are output from the both output control circuits 53 in the busy control circuits 32-1 and 32-2 (equivalent to FIG. 11). When the circuits in FIGS. 10A and 10B are used as the output control circuits 53, the /Busy1 and /Busy2 signals are output from only the output control circuit 53 in the busy control circuit 32-1 (equivalent to FIG. 12).

When the power is turned on and the power supply voltage exceeds a specified value, an initialization operation starts in each of the memory chips MC1 and MC2. The period for this initialization is indicated by the "H" level. The internal busy signals busy1 and busy2 maintain the "H" level during the initialization operation. Here, it is assumed that the memory chip MC2 requires a longer time for the initialization than the memory chip MC1.

When the initialization is complete for the memory chip MC1, the internal busy signal busy1 changes from the "H" level to the "L" level. In this case, however, the initialization is still in process for the other memory chip MC2. The internal busy signal busy2 remains at the "H" level. Accordingly, the busy signal /Busy1 remains at the "L" level. The busy signal /Busy1 is an output from the NOR circuit 52 in the busy control circuit 32-1 for the memory chip MC1. When the initialization is complete for the memory chip MC2, the internal busy signal busy2 changes from the "H" level to the "L" level. At this time, the busy signal /Busy1 for the memory chip MC1 changes to the "H" level.

When the initialization is complete for the memory chip MC2 according to FIG. 11 (using the circuits in FIGS. 9A and 9B), the internal busy signal busy2 changes from the "H" level to the "L" level. At this time, the busy signal /Busy2 changes to the "H" level. Namely, the busy signals /Busy1 and /Busy2 have the same busy period ("L" level). According to FIG. 12 (using the circuits in FIGS. 10A and 10B), the memory chip MC2 maintains the floating state for the output node (the node for the busy signal /Busy2) during the initialization period.

The transistor 51 turns on during the "H" level period for the internal busy signals busy1 and busy2 in the memory chips MC1 and MC2. The busy state output terminal 11 goes to the "L" level. The busy signal /BusyA output from the busy state output terminal 11 is set to the "L" level during a busy period corresponding to the internal busy signal busy1 or busy2 whichever causes the longer busy period. This is effective whether the circuits in FIGS. 9A and 9B or FIGS. 10A and 10B are used. Namely, the signal waveform of the busy signal /BusyA becomes practically the same as that of the /Busy1 or /Busy2.

A memory device having the busy control circuit as shown in FIG. 8 eliminates a period in which the busy signals /Busy1 and /Busy2 are set to different logical levels from each other. This prevents a short circuit between the power supply voltage Vcc and the ground voltage GND via the memory chips MC1 and MC2. Consequently, it is possible to solve all the above-mentioned various problems due to existence of a period in which the busy signals /Busy1 and /Busy2 are set to different logical levels from each other.

Figure 13:
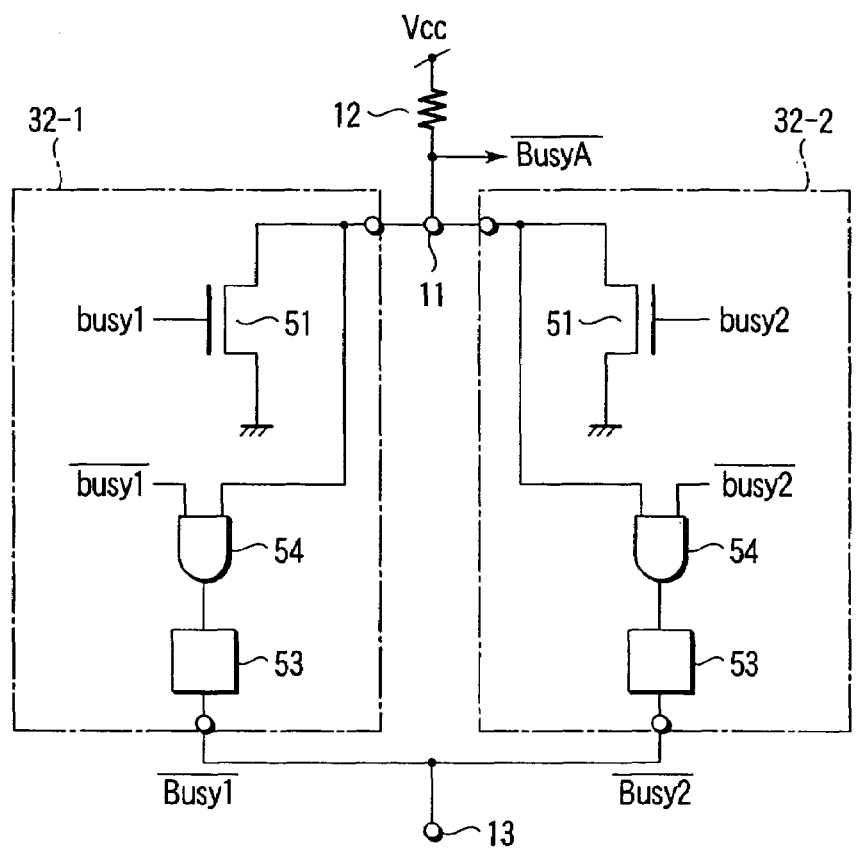
FIG. 13 is a circuit diagram specifically showing a partial configuration of a busy control circuit in a memory device according to a second embodiment.

FIG. 13 is a circuit diagram specifically showing a partial configuration of the busy control circuit 32 in the memory device according to a second embodiment of the present invention. In this case, the above-mentioned method (1) is used.

The busy control circuit 32 has the same circuit configuration in both memory chips MC1 and MC2. The busy control circuits are represented by the reference numerals 32-1 and 32-2 in the memory chips MC1 and MC2, respectively. The busy control circuits 32-1 and 32-2 each are provided with the N-channel MOS transistor 51, the output control circuit 53, and the 2-input AND circuit 54. The gate of the MOS transistor 51 is supplied with internal busy signals busy1 and busy2 generated in the memory chips MC1 and MC2. The source of the transistor 51 is connected to the ground voltage node. The drain is connected to the busy state output terminal 11 via the busy state output pad on the chip. The terminal 11 is connected to the node of the power supply voltage Vcc via the load resistor 12.

The input terminal of the AND circuit 54 is supplied with an inverted signal /busy1 (/busy2) of the internal busy signal busy1 (busy2) and the busy signal /BusyA output from the busy state output terminal 11. An output from the AND circuit 54 is fed to the I/O terminal 13 via the output control circuit 53.

In this case, the AND circuit 54 is configured to be a detection circuit for detecting busy states of the bother memory chips. When a busy state output command is entered to enable the data output, each AND circuit 54 outputs the busy signal /Busy1 or /Busy2 to the I/O terminal 13.

In the memory device in FIG. 13 according to the second embodiment, an output signal from the AND circuit 53 goes to the "L" level when either of the two input signals stays at the "L" level. The "L" level period for the busy signals /Busy1 and /Busy2 is determined by the internal busy signal busy1 or busy2 or the busy signal /BusyA whichever causes the longer "L" level period.

Accordingly, the memory device also eliminates a period in which the busy signals /Busy1 and /Busy2 are set to different logical levels from each other. This prevents a short circuit between the power supply voltage Vcc and the ground voltage GND between the memory chips MC1 and MC2 via the I/O bus 14 (see FIG. 3). Also in the case of FIG. 13, signal waveforms of the busy signals /Busy1 and /Busy2 are the same as those in FIGS. 10A, 10B and 12.

Figure 14:
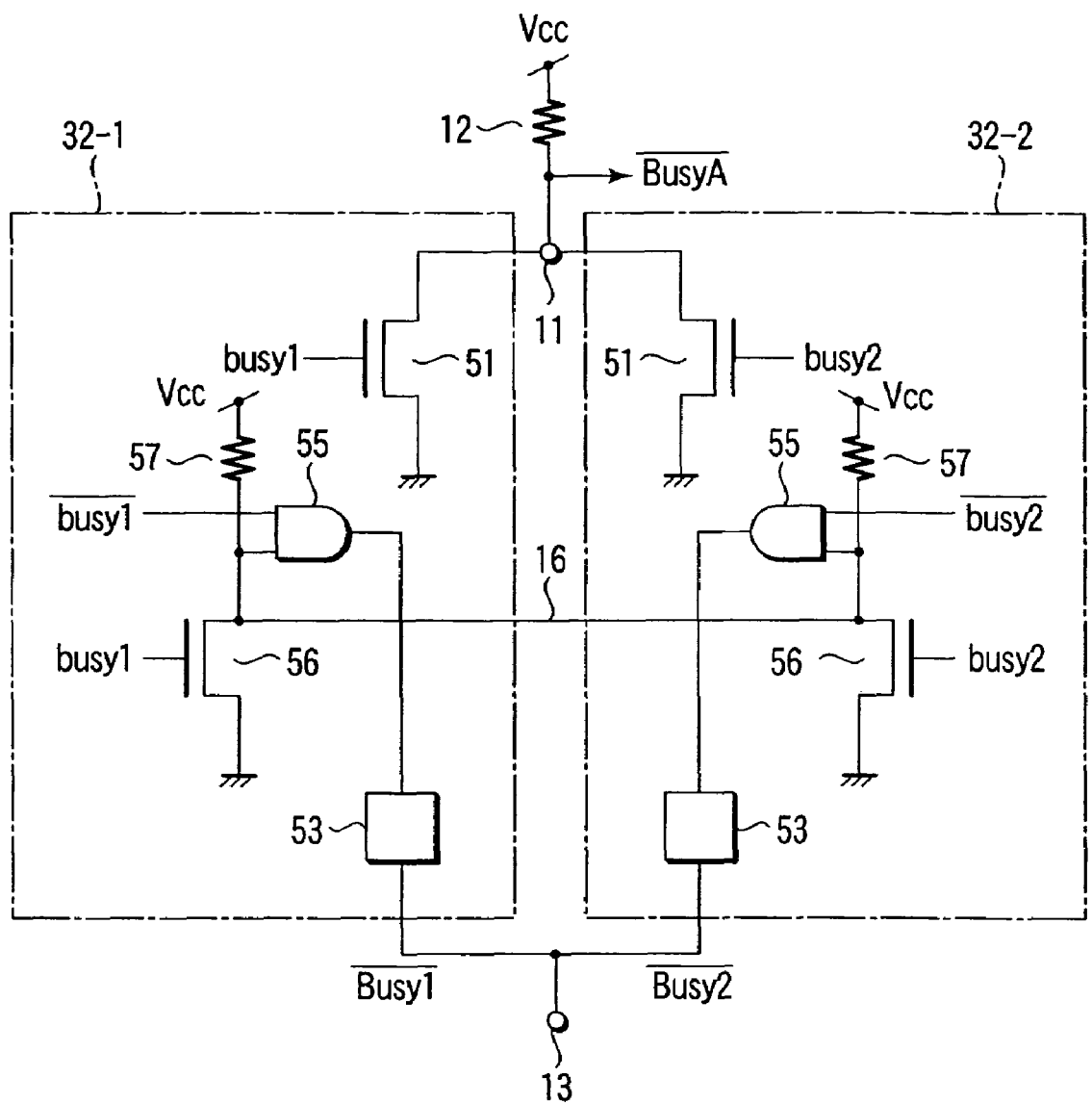
FIG. 14 is a circuit diagram specifically showing a partial configuration of a busy control circuit in a memory device according to a third embodiment.

FIG. 14 is a circuit diagram specifically showing a partial configuration of the busy control circuit 32 in the memory device according to a third embodiment of the present invention. In this case, the above-mentioned method (2) is used.

The busy control circuit 32 has the same circuit configuration in both memory chips MC1 and MC2. The busy control circuits are represented by the reference numerals 32-1 and 32-2 in the memory chips MC1 and MC2, respectively.

The busy control circuits 32-1 and 32-2 each are provided with the N-channel MOS transistor 51, the output control circuit 53, the 2-input AND circuit 55, an N-channel MOS transistor 56, and a load resistor 57. The gate of the MOS transistor 51 is supplied with internal busy signals busy1 and busy2 generated in the memory chips MC1 and MC2. The source of the transistor 51 is connected to the ground voltage node. The drain is connected to the busy state output terminal 11 via the busy state output pad on the chip. The terminal 11 is connected to the node of the power supply voltage Vcc via the load resistor 12.

One input terminal of the AND circuit 55 is supplied with an inverted signal /busy1 (/busy2) of the internal busy signal busy1 (busy2). The source/drain region of the MOS transistor 56 are inserted between the other input terminal of the AND circuit 55 and the ground voltage node. The MOS transistor 56 functions as a switch. The internal busy signal busy1 is input to the gate of the MOS transistor 56. The load resistor 57 is connected between the other input terminal of the AND circuit 55 and the node of the power supply voltage Vcc. The drain of the MOS transistor 56, i.e., the other input terminal of the AND circuit 55 is commonly connected between different chips via the wire 16. An output from the AND circuit 55 is fed to the I/O terminal 13 via the output control circuit 53.

In this case, a circuit including the AND circuit 55, the MOS transistor 56, and the load resistor 57 is configured to be a detection circuit for detecting busy states of the other memory chips. When a busy state output command is entered to enable the data output, each AND circuit 55 outputs the busy signal /Busy1 or /Busy2 from the I/O terminal 13 via the output control circuit 53 and the I/O pad on the chip.

In the memory device in FIG. 14 according to the third embodiment, the MOS transistor 56 is controlled by the internal busy signals busy1 and busy2. The wire 16 is used to commonly connect the drain of the MOS transistor 56, i.e., the other input terminal of the AND circuit 55 between different chips. An input signal to the other input terminal of the AND circuit 55 is set to the "L" level by the internal busy signal busy1 or busy2 whichever causes the longer "H" level period while that signal maintains the "H" level.

After the power is turned on, an output signal from the AND circuit 55 goes to the "H" level when two input signals concurrently go to the "H" level. Also in this case, the memory device eliminates a period in which the busy signals /Busy1 and /Busy2 are set to different logical levels from each other. This prevents a short circuit between the power supply voltage Vcc and the ground voltage GND between the memory chips MC1 and MC2 via the I/O terminal 13 (see FIG. 3).

Figure 15:
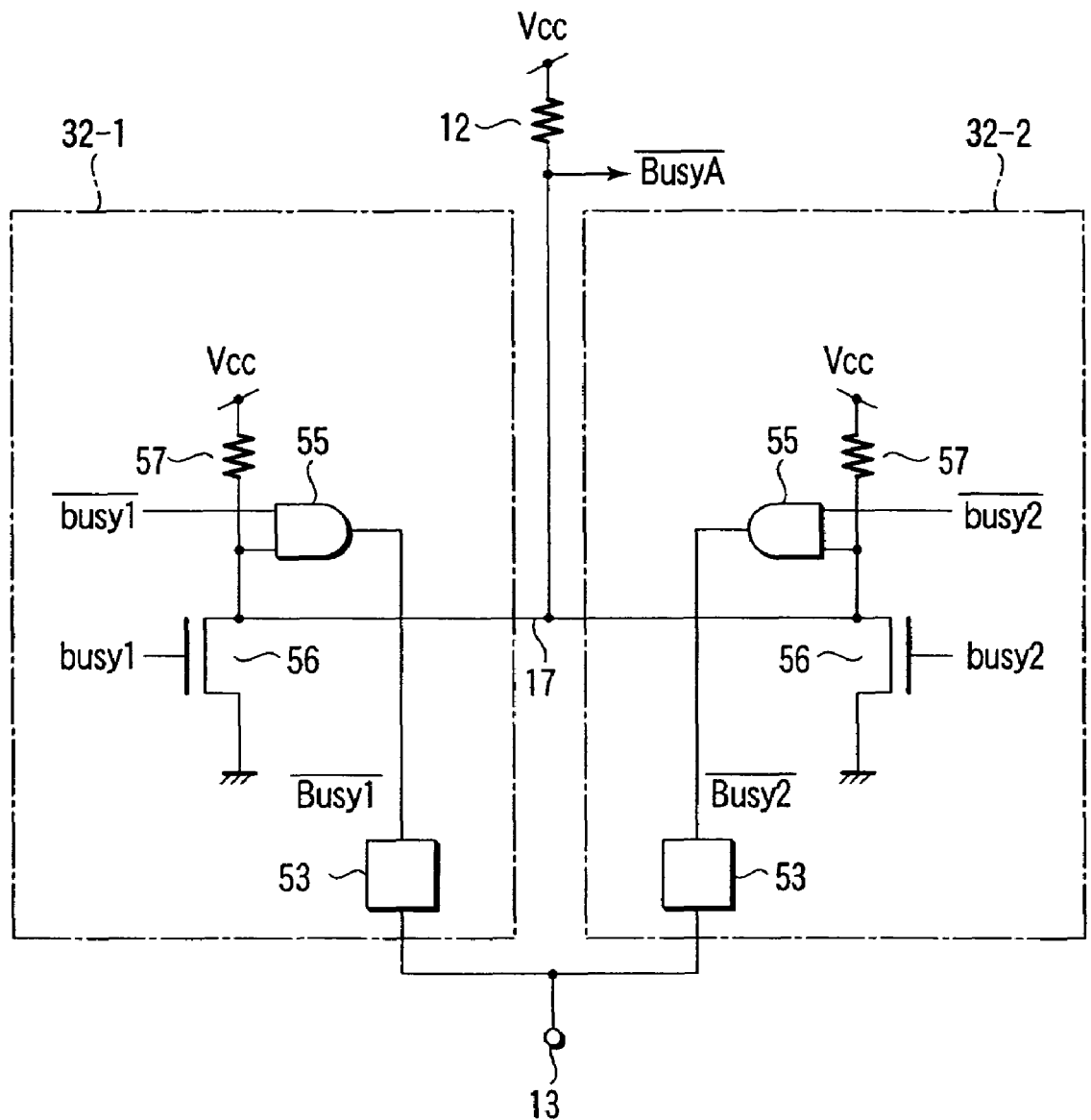
FIG. 15 is a circuit diagram specifically showing a partial configuration of a busy control circuit in a memory device according to a modification of the third embodiment.

FIG. 15 shows a memory device according to a modification of the third embodiment. The busy control circuits 32-1 and 32-2 in the memory device according to the modification have basically the same configuration as that shown in FIG. 14. The mutually corresponding parts in FIGS. 15 and 14 are designated by the same reference numerals and a detailed description is omitted for simplicity. The following describes only portions that differ from FIG. 14.

The MOS transistor 51 in FIG. 14 is omitted from the busy control circuits 32-1 and 32-2 in the memory device according to the modification. The load resistor 12 is connected to the common drain of the MOS transistor 56, i.e., to the wire 17. This is because the busy state output terminal 11 is also used with the wire in FIG. 14.

The memory device in FIG. 15 according to the modification of the third embodiment provides the same effects as those described with reference to FIG. 14. Because the transistor 51 is not used, there is an additional advantage of decreasing the number of elements compared to FIG. 14.

As described in the first through third embodiments and the modification, the load resistor 12 is connected outside the chip to the busy state output terminal 11 or the wire 17 where the busy signal /BusyA is output. The terminal 11 or the wire 17 is always pulled up to the "H" level (Vcc).

However, the present invention is also applicable when the busy state output terminal 11 is not always pulled up to the "H" level outside the chip.

Generally, two methods of detecting the busy state of a package product are available: (A) always pulling up the busy state output terminal to the "H" level for detecting a signal at this terminal and (B) outputting a signal from the I/O pad after entering a busy state output command to enable the data output. When using only method (B), a user or a system does not detect the busy state by using the busy state output terminal 11. It is unnecessary to pull up the busy state output terminal 11 to the "H" level outside the chip.

FIG. 16 shows a memory device according to a fourth embodiment of the present invention by using the above-mentioned method (B). FIG. 16 is a circuit diagram specifically showing a partial configuration of the busy control circuit 32 in FIG. 4 provided for each of the two memory chips MC1 and MC2 in FIG. 3.

The busy control circuit 32 has the same circuit configuration in both memory chips MC1 and MC2. The busy control circuits are represented by the reference numerals 32-1 and 32-2 in the memory chips MC1 and MC2, respectively. The busy control circuits 32-1 and 32-2 in the memory device according to the fourth embodiment have basically the same configuration as that shown in FIG. 15. The mutually corresponding parts in FIGS. 16 and 15 are designated by the same reference numerals and a detailed description is omitted for simplicity. The following describes only portions that differ from FIG. 15.

As mentioned above, the user or the system does not monitor the wire for busy state output in the memory device according to the fourth embodiment. Accordingly, there is not provided the load resistor 12 connected to the wire 17. The wire 17 mutually connects the memory chips MC1 and MC2 with each other. The busy signal /BusyA is output from each of the memory chips MC1 and MC2 to the busy state output pad. Basically, the pad is not connected outside the chip.

The busy state output pads in both chips are commonly connected to the wire 17. In order to detect a signal on the wire 17 for busy state detection, the node of the wire 17 needs to be pulled up to the "H" level. The load resistor 57 is provided in each of the busy control circuits 32-1 and 32-2, and is used as an element for pulling up the node of e wire 17.

Also in the memory device according to the embodiment, a busy signal is interchanged between different busy control circuits via the wire 17. The memory device eliminates a period in which the busy signals /Busy1 and /Busy2 are set to different logical levels from each other. This prevents a short circuit between the power supply voltage Vcc and the ground voltage GND between the memory chips MC1 and MC2 via the I/O terminal 13 (see FIG. 3).

Figure 17:
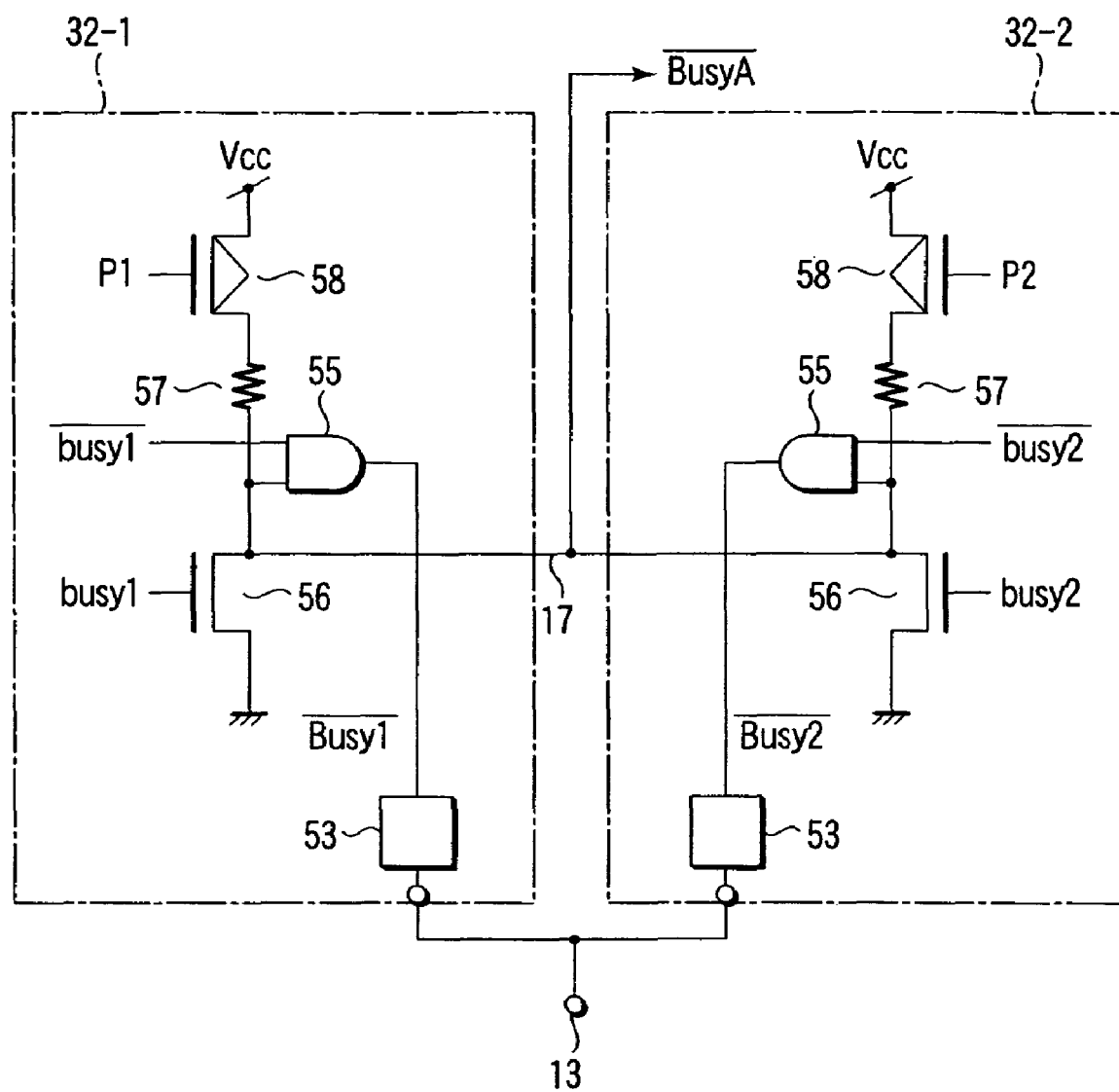
FIG. 17 is a circuit diagram specifically showing a partial configuration of a busy control circuit in a memory device according to a fifth embodiment.

FIG. 17 shows a memory device according to a fifth embodiment of the present invention by using the above-mentioned method (B) when the user or the system does not monitor the wire 17 for busy state output. FIG. 17 is a circuit diagram specifically showing a partial configuration of the busy control circuit 32 in FIG. 4 provided for each of the two memory chips MC1 and MC2 in FIG. 3.

The busy control circuit 32 has the same circuit configuration in both memory chips MC1 and MC2. The busy control circuits are represented by the reference numerals 32-1 and 32-2 in the memory chips MC1 and MC2, respectively. The busy control circuits 32-1 and 32-2 in the memory device according to the fifth embodiment have basically the same configuration as that shown in FIG. 16. The mutually corresponding parts in FIGS. 17 and 16 are designated by the same reference numerals and a detailed description is omitted for simplicity. The following describes only portions that differ from FIG. 16.

The memory device according to the embodiment differs from that in FIG. 16 as follows. The source/drain region of a P channel MOS transistor 58 is inserted between the load resistor 57 and the node of the power supply voltage Vcc in the busy control circuits 32-1 and 32-2. A control signal P1 or P2 is used to control the gate of the MOS transistor 58.

In this configuration, the P-channel MOS transistor 58 is controlled by the control signal P1 or P2 to on-state during the period after the chip initialization starts at the power-on time until all memory chips have been initialized. The node of the wire 17 is pulled up to the "H" level only while the package product is initialized. After the initialization is complete, the MOS transistor 58 is turned off, saving an electric current.

In the busy state, each of the memory chips MC1 and MC2 enables the "L" level for the I/O pad which outputs the busy signal /Busy1 or /Busy2. Sizes and so on of the MOS transistors 58 and 56 are predetermined so that the current drive force of the N-channel MOS transistor 56 becomes higher than that of the P-channel MOS transistor 58 and the load resistor 57.

The memory device according to the embodiment provides the same effects as those of the first through fourth embodiments and the modification thereof. Further, there is an additional advantage of saving an electric current after completion of the initialization operation.

When only one memory chip is provided in the package, it is unnecessary to detect busy states of the other memory chips, eliminating the need for the function of pulling up the node of the busy signal /BusyA. In this case, it is effective to disable exactly the operation of pulling up the node of the busy signal /BusyA.

FIG. 18 shows a memory device according to a sixth embodiment of the present invention by using the above-mentioned method (B) when the user or the system does not monitor the busy state output terminal 11. FIG. 18 is a circuit diagram specifically showing a partial configuration of the busy control circuit 32 in FIG. 4 when there is provided either of the two memory chips MC1 and MC2 in FIG. 3.

The busy control circuits 32-1 and 32-2 in the memory device according to the sixth embodiment have basically the same configuration as that shown in FIG. 17. The mutually corresponding parts in FIGS. 18 and 17 are designated by the same reference numerals and a detailed description is omitted for simplicity.

The memory device according to the embodiment is provided with only one memory chip. The "H" level always takes effect for the control signal P1 input to the gate of the P channel MOS transistor 58. The MOS transistor 58 always remains off.

When the memory device is provided with a plurality of memory chips as shown in FIG. 17, nodes for the busy signal /BusyA can be simultaneously pulled up for all memory chips in the memory device during the initialization at the power-on time. In this case, it is unnecessary to distinguish memory chips in the memory device, providing an advantage of simplified control. However, all memory chips on the memory device consume an electric current, increasing the power consumption.

As a solution, control may be provided to pull up nodes for the busy signal /BusyA only in some memory chips on the memory device. This decreases the consumed current and highly effectively improves the power consumption.

There are available the following methods of controlling which memory chips in the memory device should pull up nodes for the busy signal /BusyA.

Normally, when the package is provided with a plurality of memory chips, different chip addresses are allocated to the chips for selecting them distinctively. There is a method of pulling up the node for the busy signal /BusyA only in a chip having the smallest allocated chip address (e.g., the chip having the address 0). Another method is to pull up the node for the busy signal /BusyA only in chips having even-numbered (or odd-numbered) chip addresses.

When the package is provided with a plurality of memory chips, it is very effective with respect to power consumption to pull up nodes for the busy signal /BusyA in some memory chips. This method prevents nodes for the busy signal /BusyA from being pulled up simultaneously in all memory chips. Implementation of this method requires an additional control circuit for setting logical levels of the control signals P1 and P2 based on the chip addresses so as to control the on/off state of the MOS transistor 58 according to the chip addresses.

FIGS. 19A and 19B show configurations of the control circuits for activating only the P-channel MOS transistor 58 in a chip with the smallest chip address, i.e., in the busy control circuit 32-1 according to the embodiment in FIG. 17.

The control circuit in FIG. 19A is provided in the busy control circuit 32-1. The control circuit includes an inverter 111 and a NAND circuit 112. The inverter 111 inverts the control signal P1. The NAND circuit 112 is supplied with an output from the inverter 111 and a chip address chip Add0. An output from the NAND circuit 112 is supplied to the gate of the P-channel MOS transistor (PMOS) 58 in the busy control circuit 32-1.

The control circuit in FIG. 19B has basically the same configuration as that in FIG. 19A. The only difference is that the control signal P2 is input to the inverter 111 in FIG. 19B. An output from the NAND circuit 112 is supplied to the gate of the P-channel MOS transistor (PMOS) 58 in the busy control circuit 32-2.

Here, it is assumed that chip address chip Add0 is allocated to the memory chip MC1 where the busy control circuit 32-1 is provided and that chip address chip Add1 is allocated to the memory chip MC2 where the busy control circuit 32-2 is provided. Then, the chip address chip Add0 supplied to the busy control circuit 32-1 is the "H" level. The chip address chip Add0 supplied to the busy control circuit 32-2 is the "L" level. When the control signal P1 maintains the "L" level, an output from the NAND circuit 112 on the busy control circuit 32-1 goes to the "L" level, activating the P-channel MOS transistor 58 on the busy control circuit 32-1. Namely, the MOS transistor 58 is activated only in the memory chip MC1 to pull up the node for the busy signal /BusyA.

The memory device in FIG. 17 according to the fifth embodiment controls the on/off state of the MOS transistor 58 based on the number of memory chips installed and chip addresses. Thus, the power consumption can be decreased.

Normally, when a plurality of memory chips is mounted on a package product, the chip addresses therein can be specified as follows. One method is to select a bonding option to supply a specified potential to a specified pad by means of bonding. Another method is to selectively blow fuses in the chip.

FIG. 20 shows a configuration of another control circuit to activate the P-channel MOS transistor 58 in only one chip based on a chip address according to the embodiment in FIG. 17.

FIG. 20 shows a partial configuration of the busy control circuit 32-1 in the memory chip MC1, for example. The chip address chip Add0 corresponds to the memory chip MC1 and is supplied to one input terminal of the NOR circuit 114 via a switch circuit 113. The chip address chip Add1 corresponds to the memory chip MC2 and is supplied to the other input terminal of the NOR circuit 114 via a switch circuit 115. An output from the NOR circuit 114 is supplied to one input terminal of a NAND circuit 117 via an inverter 116. The other input terminal of the NAND circuit 117 is supplied with the control signal P1 via an inverter 118.

It is assumed that one of switch circuits 113 and 115 is controlled to turn on in this configuration. For example, the switch circuit 113 is assumed to turn on. When the chip address chip Add0 is input, it is supplied to the NOR circuit 114 via the switch circuit 113. An output from the NOR circuit 114 becomes the "L" level. At this time, an output from the inverter 116 becomes the "H" level. When the control signal P1 maintains the "L" level, an output from the NAND circuit 117 becomes the "L" level, activating the P-channel MOS transistor in the busy control circuit 32-1 in FIG. 17.

When the switch circuit 115 is also controlled to turn on, both the chip addresses chip Add0 and chip Add1 are input to the NOR circuit 114 via the switch circuits 113 and 115.

FIG. 21 shows a detailed configuration of the switch circuit 113 or 115 in FIG. 20. The switch circuit controls chip address output by means of a bonding option. The switch circuit includes a CMOS transfer gate 200, a resistor 201, a pad 202, an inverter 203, and an N channel MOS transistor 204.

The CMOS transfer gate 200 provides parallel connection between source/drain regions of the P-channel and N-channel MOS transistors. The pad 202 is pulled up to Vcc via thee resistor 201. An input terminal of the inverter 203 is connected to the pad 202. In the N-channel MOS transistor 204, the source/drain region is connected between the output node of the CMOS transfer gate 200 and the ground voltage node. The gate is supplied with an output from the inverter 203. A signal from the pad 202 and an output from the inverter 203 are supplied to the gates of the N-channel and the P-channel MOS transistor of the CMOS transfer gate 200.

In this configuration, when the pad 202 is not connected to the ground voltage node by using a bonding wire, the pad 202 is pulled up to the "H" level via the resistor 201. Then, the CMOS transfer gate 200 turns on. When the CMOS transfer gate 200 turns on, the chip address chip Add0 or chip Add1 is input to the NOR circuit 114 via the CMOS transfer gate 200.

When a bonding wire 205 is used to connect the pad 202 to the ground voltage node as shown in FIG. 21, the pad 202 becomes the "L" level. The CMOS transfer gate 200 turns off. At this time, an output from the inverter 203 becomes the "H" level. The N-channel MOS transistor 204 turns on. The output node for the CMOS transfer gate 200 is set to the ground voltage.

The circuit in FIG. 21 can use the bonding wire 205 to connect or not to connect the pad 202 to the ground voltage node for selectively controlling chip address output.

Figure 22:
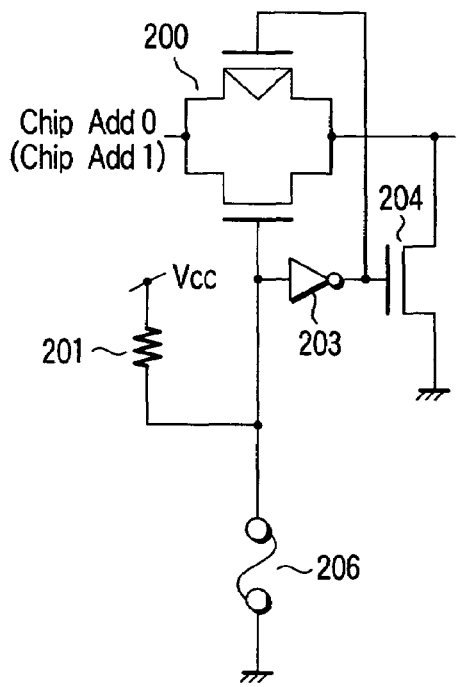
FIG. 22 is a circuit diagram showing another detailed configuration of the switch circuit in FIG. 20.

FIG. 22 shows another detailed configuration of the switch circuit 113 or 115 in FIG. 20. The switch circuit controls chip address output by selectively blowing fuses on the chip. The configuration of the switch circuit partly differs from that of the switch circuit in FIG. 21. A description is omitted for the same portions as in FIG. 21. The following describes only portions that differ from FIG. 21.

In this switch circuit, a fuse 206 is connected between the input node of the inverter 203 and the ground voltage node. The fuse 206 can be blown by electromagnetic irradiation, for example.

When the fuse 206 is blown in this configuration, the pad 202 is pulled up to the "H" level via the resistor 201, turning on the CMOS transfer gate 200. When the CMOS transfer gate 200 keeps the ON state, the chip address chip Add0 or chip Add1 is input to the NOR circuit 114 via the CMOS transfer gate 200.

When the fuse 206 is not blown, the pad 202 goes to the "L" level, turning off the CMOS transfer gate 200. At this time, an output from the inverter 203 goes to the "H" level. The N-channel MOS transistor 204 turns on. The output node for the CMOS transfer gate 200 is set to the ground voltage.

The circuit in FIG. 22 can selectively control chip address output by blowing or not blowing the fuse 206.

During the chip initialization, it is also effective to configure the PMOS transistor so that the transistor turns on for the chip with chip Add0 and turns off for a specific or all chips with chip Add1 or higher.

When the package includes only one chip as shown in FIG. 18, the chip address is set to 0. When a chip with chip address 1 is configured to always turn on the PMOS transistor 58, a product including a single chip automatically turns off the PMOS transistor. A chip including a plurality of chips necessarily includes two chips with chip addresses 0 and 1. Such product turns on the PMOS transistor in the chip with chip address 1. The above-mentioned pull-up operation is implemented automatically. Thus, it is easy to configure a chip with chip address 1 to always perform a pull-up operation during the chip initialization by using the circuits in FIGS. 20 through 22 and configuring boding and fuse setting. Further, it is possible to configure a chip with chip address 1 to always perform a pull-up operation during the chip initialization by providing all chips with the circuit in FIGS. 23A and 23B having chip Add0 changed to chip Add1 for the circuit in FIGS. 19A and 19B. In this case, there is no need the configuring boding and fuse setting.

Figure 24:
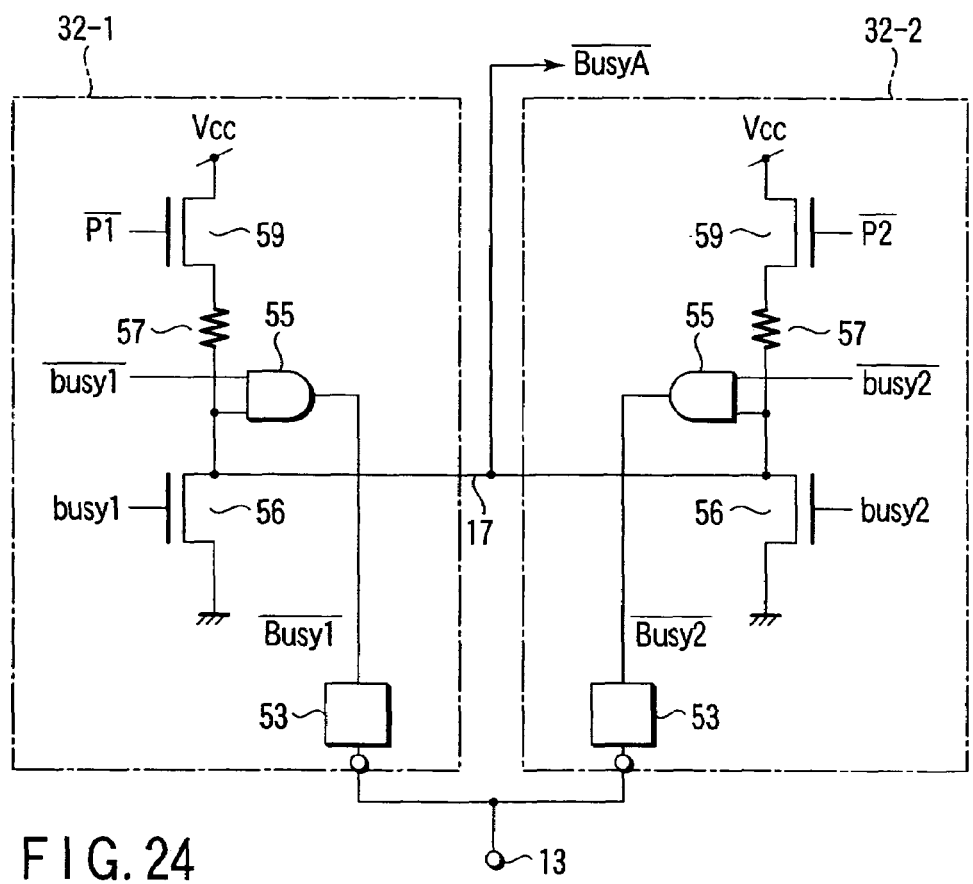
FIG. 24 is a circuit diagram specifically showing a partial configuration of a busy control circuit in a memory device according to a seventh embodiment.

FIG. 24 shows a memory device according to a seventh embodiment of the present invention by using the above-mentioned method (B) when the user or the system does not monitor the wire 17 for busy state output. FIG. 24 is a circuit diagram specifically showing a partial configuration of the busy control circuit 32 in FIG. 4 provided for each of the two memory chips MC1 and MC2 in FIG. 3.

The busy control circuit 32 has the same circuit configuration in both memory chips MC1 and MC2. The busy control circuits are represented by the reference numerals 32-1 and 32-2 in the memory chips MC1 and MC2, respectively. The busy control circuits 32-1 and 32-2 in the memory device according to the seventh embodiment have basically the same configuration as that shown in FIG. 17. The mutually corresponding parts in FIGS. 24 and 17 are designated by the same reference numerals and a detailed description is omitted for simplicity. The following describes only portions that differ from FIG. 17.

The memory device in FIG. 17 connects the P-channel MOS transistor 58 between the load resistor 57 and the node for the power supply voltage Vcc. Instead, the seventh embodiment connects an N-channel MOS transistor 59 therebetween. Accordingly, the gate of the N-channel MOS transistor 59 is supplied with logically inverted control signals /P1 and /P2 instead of P1 and P2.

It is to be distinctly understood that the present invention is not limited to the above-mentioned embodiments but may be otherwise variously embodied within the spirit and scope of the invention. According to the above-mentioned embodiments, the memory cell comprises the NAND-cell type EEROM. Each NAND cell is provided with eight serially connected memory cells. Obviously, the present invention can be embodied when each NAND cell may contain one, two, four, 16, 32, or 64 memory cells.

Figure 25:
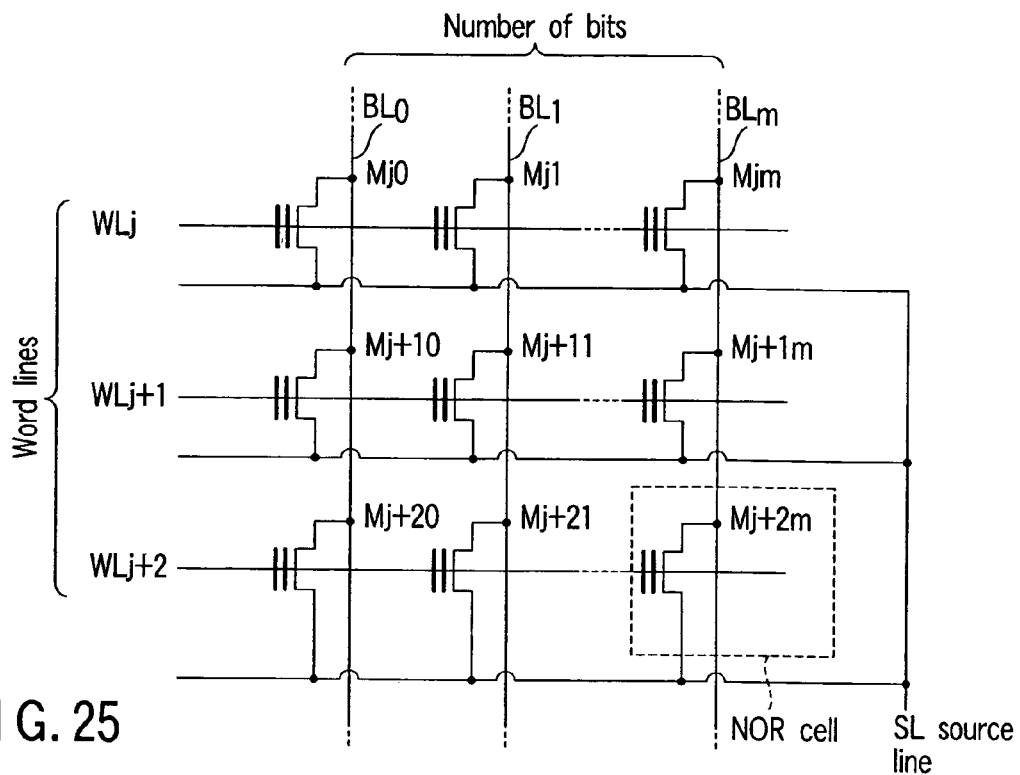
FIG. 25 is an equivalent circuit diagram showing another configuration of the memory cell array in FIG. 4.
Figure 26:
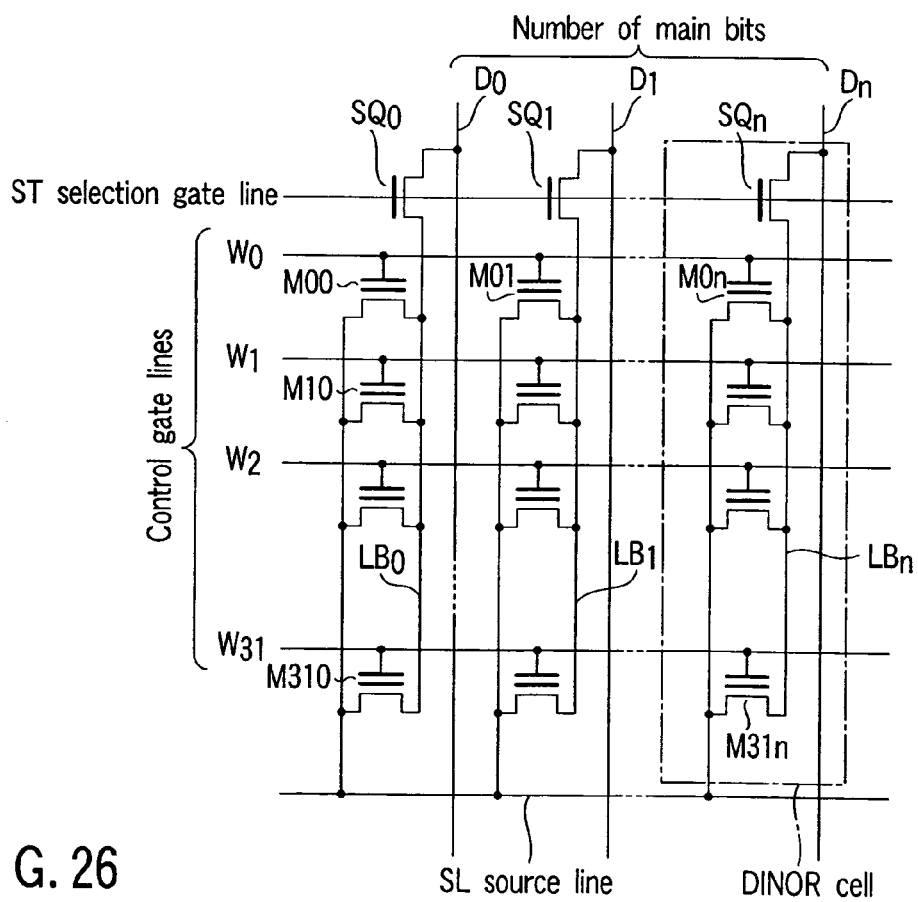
FIG. 26 is an equivalent circuit diagram showing still another configuration of the memory cell array in FIG. 4.
Figure 27:
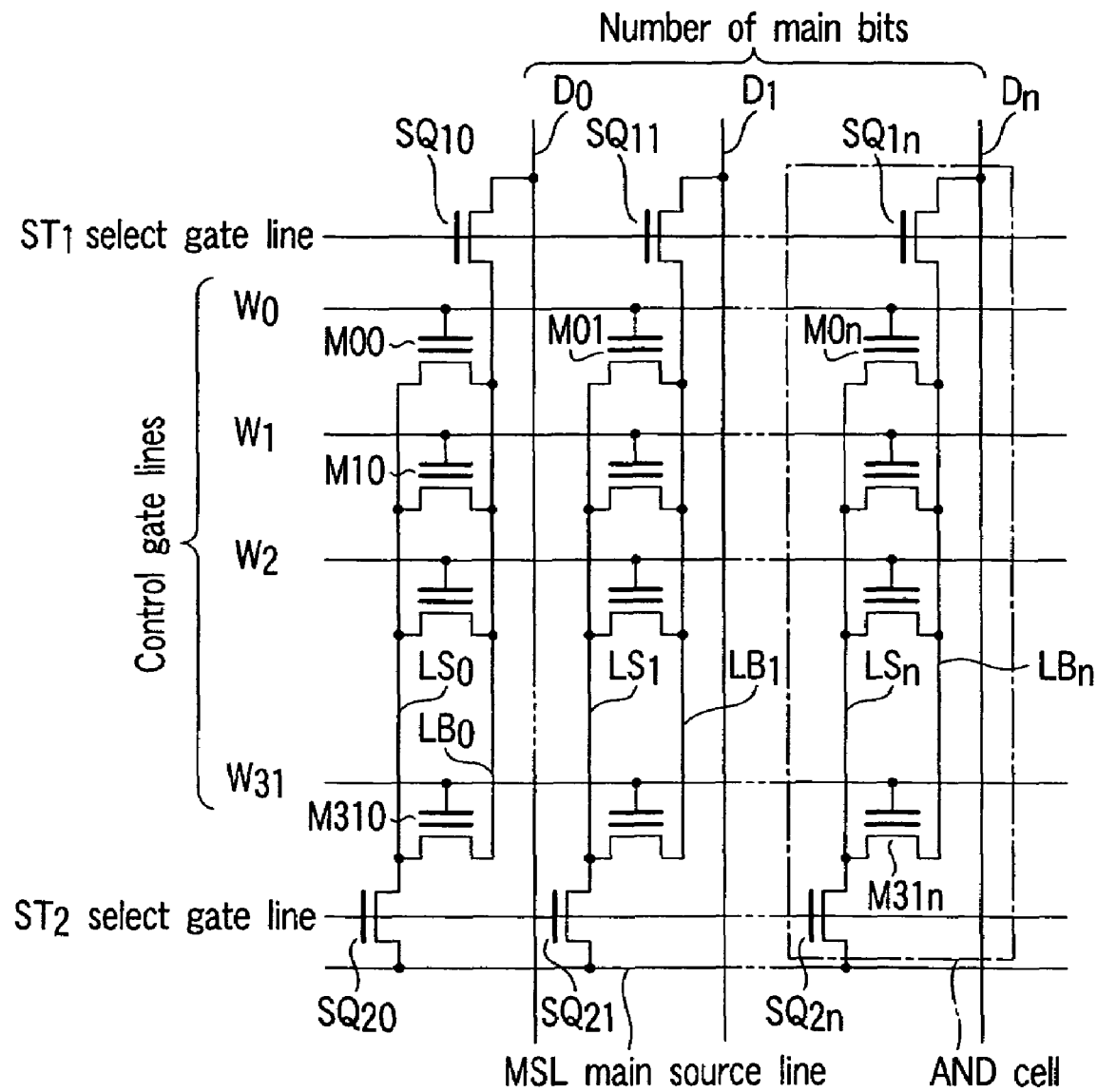
FIG. 27 is an equivalent circuit diagram showing yet another configuration of the memory cell array in FIG. 4.
Figure 28:
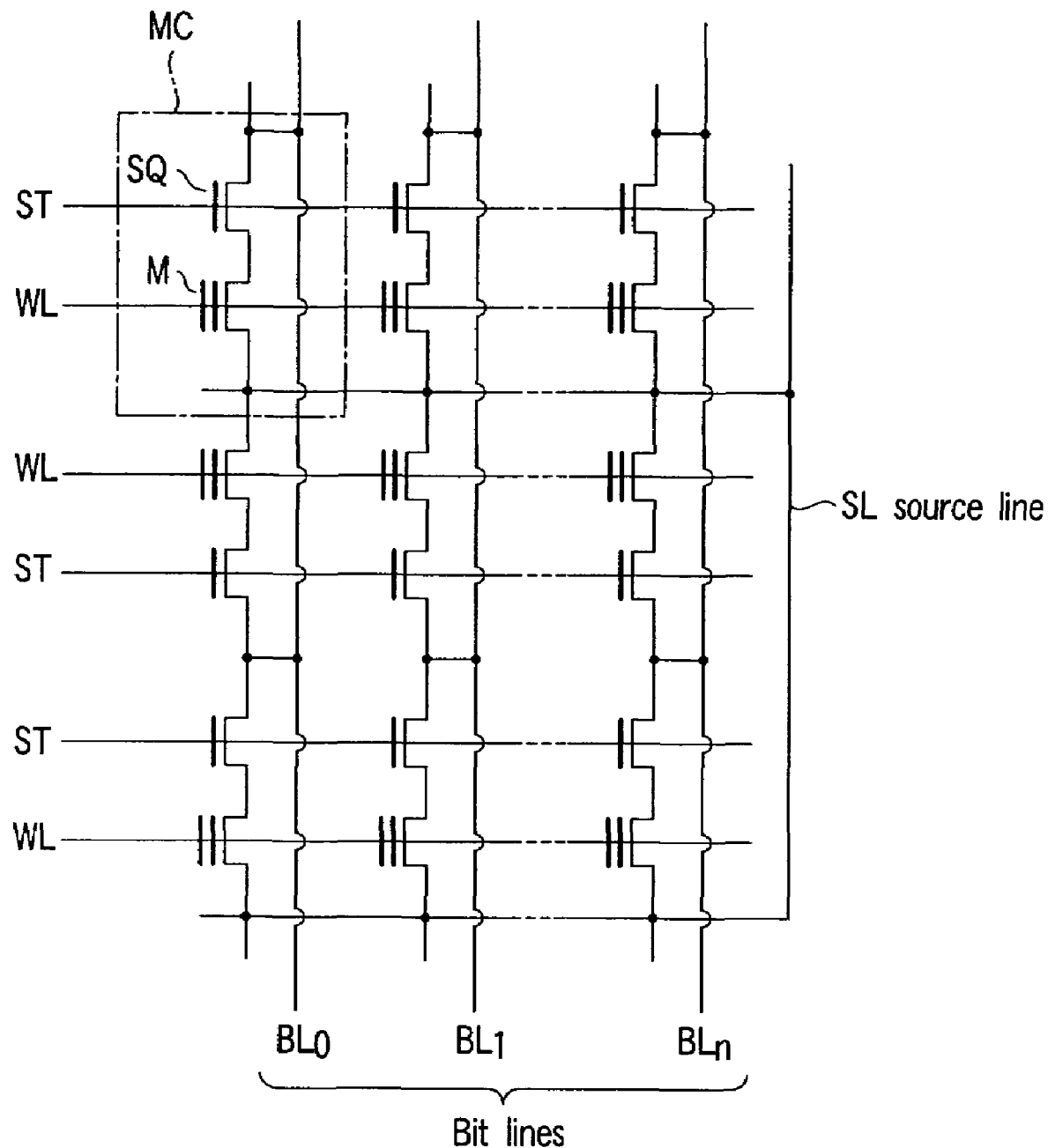
FIG. 28 is an equivalent circuit diagram showing still yet another configuration of the memory cell array in FIG. 4.
Figure 31:
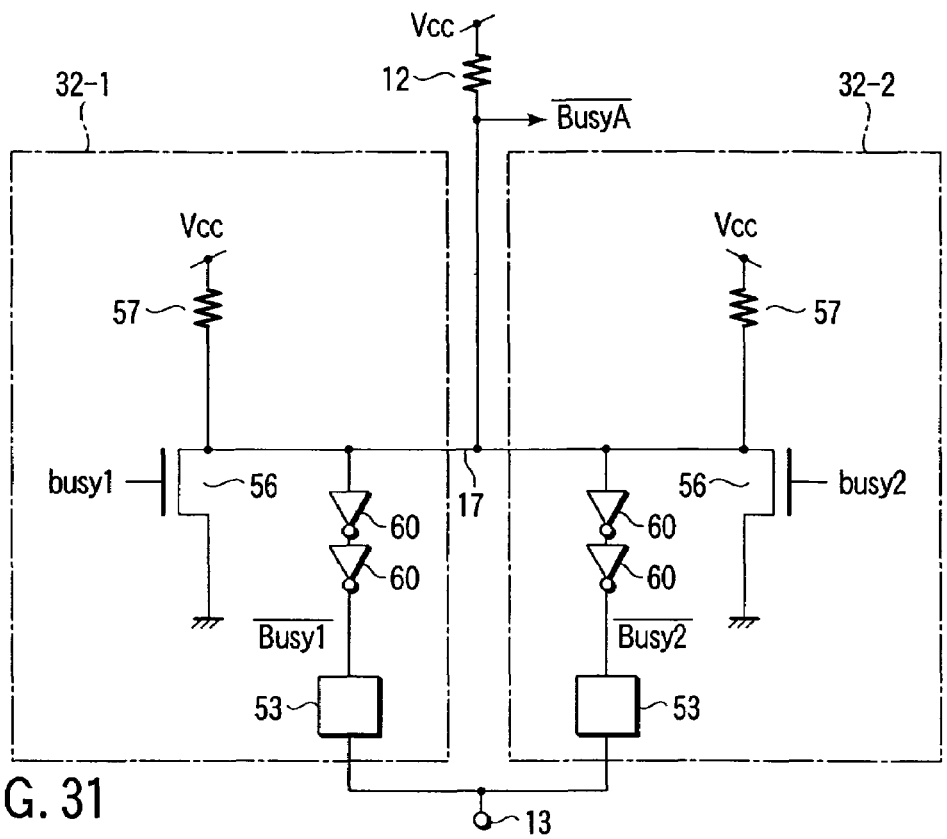
FIG. 31 is a circuit diagram showing a modified configuration of the circuit embodied in FIG. 15.
Figure 32:
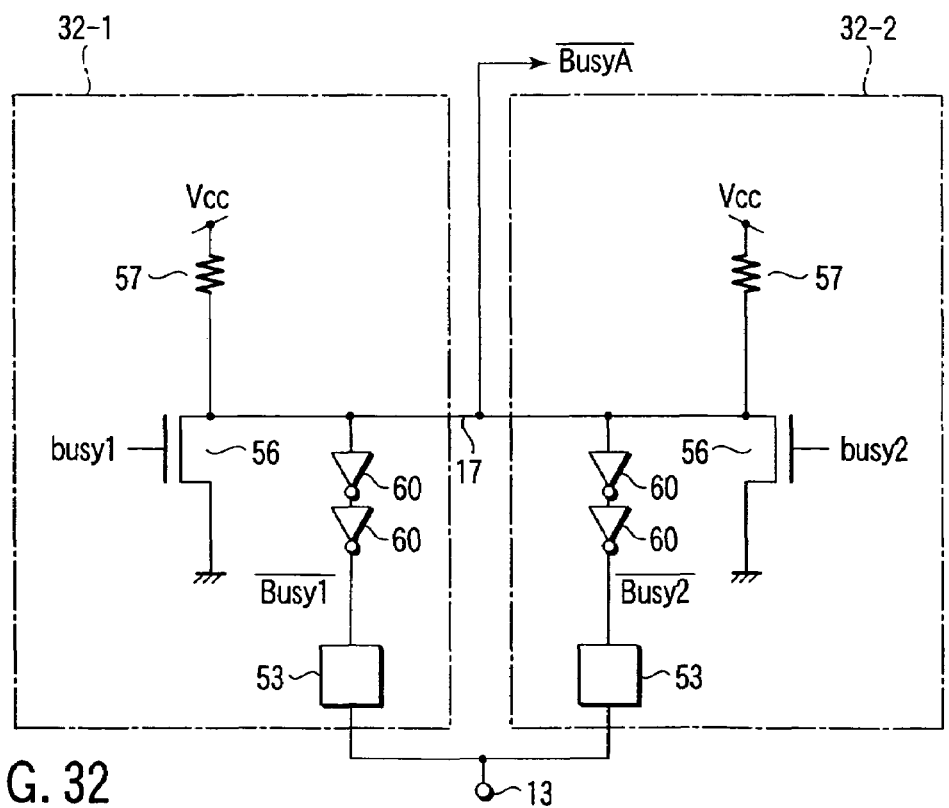
FIG. 32 is a circuit diagram showing a modified configuration of the circuit embodied in FIG. 16.

In addition to the memory chip including the NAND-cell type EEROM, for example, it may be preferable to use a memory chip including the NOR-cell type EEROM according to the equivalent circuit in FIG. 25, a memory chip including the DINOR-cell type EEROM according to the equivalent circuit in FIG. 26, a memory chip including the AND-cell type EEROM according to the equivalent circuit in FIG. 27, and a memory chip including the NOR-cell type EEROM with the selective transistor according to the equivalent circuit in FIG. 28. The details of the DINOR-cell type EEROM are described in H. Onoda et al., IEDM Technical Digest Paper, 1992. pp. 599-602. The details of the AND-cell type EEROM are described in H. Kume et al., IEDM Technical Digest Paper, 1992. pp. 991-993.

The above-mentioned embodiments have been described by using the nonvolatile semiconductor memory device capable of electrically rewriting data as an example. The present invention can be likewise embodied for the other semiconductor memory devices.

Further, the above mentioned embodiments have explained that the node for the busy signal /BusyA is pulled up only during the initialization operation at the power-on time in the memory chip. The node for the busy signal /BusyA can be pulled up otherwise, e.g., during a normal operation period or when only one memory chip is provided. In this case, in the system which monitors the busy signal /Busy A, there is provided an effect of not having to provide a pull-up circuit outside the package.

Figure 23A:
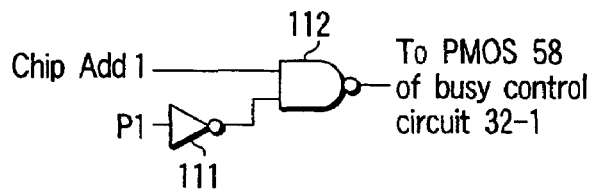
FIGS. 23A and 23B are circuit diagrams showing another configuration of the control circuits provided in the circuit according to the embodiment in FIG. 17.
Figure 23B:
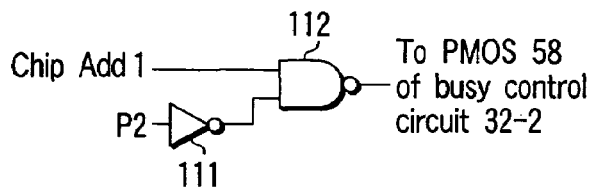

The above-mentioned embodiments have explained the case where a pull-up operation is performed irrespectively of whether the memory chip selected for the pull-up operation is busy or ready. It is possible to control not to perform a pull-up operation when the memory chip selected for the pull-up operation is busy, for example. When the selected memory chip is busy, the transistor 56 in the busy control circuit 32-1 in FIG. 17 stays the on state. In this state, turning on the transistor 58 generates a current between the power supply voltage Vcc and the ground voltage GND, just increasing a wasteful current. It is desirable to pull up the node for the busy signal /BusyA only when the memory chip selected for the pull-up operation is ready, only during the initialization at the power-on time, or during abnormal operation. As a result, it is possible to offer low power consumption. The present invention is also effective when the circuits embodied in FIGS. 23A and 23B are modified to those shown in FIGS. 34A and 34B, 35A and 35B, 36, 37A and 37B.

The present invention is also effective when the circuits embodied in FIGS. 13 through 17 are modified to those shown in FIGS. 29 through 33. The modified circuits in FIGS. 29 through 33 show configuration examples in which the serially connected two inverters 60 replace the AND circuits 54 and 55 in the embodied circuits in FIGS. 13 through 17.

The modified circuits in FIGS. 29 through 33 also can provide operations equivalent to those for the embodied circuits in FIGS. 13 through 17. The use of two inverters can decrease the number of elements.

Obviously the present invention is effective when the busy state output pad generates an inverted signal level polarity.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory system comprising:
   a first semiconductor memory device including a first circuit, and a second semiconductor memory device including a second circuit,
   the second circuit detects a first busy state of the first semiconductor memory device, and the first circuit detects a second busy state of the second semiconductor memory device.

2. The semiconductor memory system according to claim 1, wherein the second circuit outputs a first busy signal which reflects the first busy state, and the first circuit outputs a second busy signal which reflects the second busy state.

3. The semiconductor memory system according to claim 1, wherein the first circuit includes a first logic gate, and the second circuit includes a second logic gate.

4. The semiconductor memory system according to claim 3, wherein the first logic gate is a first NOR gate, and the second logic gate is a second NOR gate.

5. The semiconductor memory system according to claim 3, wherein the first logic gate is a first AND gate, and the second logic gate is a second AND gate.

6. The semiconductor memory system according to claim 1, wherein the first circuit detects the first busy state and the second circuit detects the second busy state while at least the first semiconductor memory device and the second semiconductor memory device are performing an initialization operation.

7. The semiconductor memory system according to claim 6, wherein the first circuit detects the first busy state and the second circuit detects the second busy state only while the first semiconductor memory device and the second semiconductor memory device are performing an initialization operation.

8. A semiconductor memory system comprising:
   a first semiconductor memory device including a first circuit, and a second semiconductor memory device including a second circuit,
   wherein the second circuit is configured to detect a first signal, the first circuit is configured to detect the first signal, and the first signal is affected by both a first busy state of the first semiconductor memory device and a second busy state of the second semiconductor memory device.

9. The semiconductor memory system according to claim 8, wherein the first circuit includes a first logic gate, and the second circuit includes a second logic gate.

10. The semiconductor memory system according to claim 9, wherein the first logic gate is a first NOR gate, and the second logic gate is a second NOR gate.

11. The semiconductor memory system according to claim 9, wherein the first logic gate is a first AND gate, and the second logic gate is a second AND gate.

12. The semiconductor memory system according to claim 8, wherein the first circuit detects the first busy state and the second circuit detects the second busy state while at least the first semiconductor memory device and the second semiconductor memory device is performing an initialization operation.

13. The semiconductor memory system according to claim 12, wherein the first circuit detects the first busy state and the second circuit detects the second busy state only while the first semiconductor memory device and the second semiconductor memory device are performing an initialization operation.

* * * * *